United States Patent
Onaka et al.

(10) Patent No.: US 12,385,765 B2
(45) Date of Patent: Aug. 12, 2025

(54) POSITION DETECTION SYSTEM

(71) Applicant: Panasonic Intellectual Property Management Co., Ltd., Osaka (JP)

(72) Inventors: Kazuhiro Onaka, Hyogo (JP); Noritaka Ichinomiya, Nara (JP); Naoki Kohara, Osaka (JP); Takafumi Tsushima, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 133 days.

(21) Appl. No.: 18/249,677

(22) PCT Filed: Oct. 26, 2021

(86) PCT No.: PCT/JP2021/039549
§ 371 (c)(1),
(2) Date: Apr. 19, 2023

(87) PCT Pub. No.: WO2022/092113
PCT Pub. Date: May 5, 2022

(65) Prior Publication Data
US 2023/0384125 A1  Nov. 30, 2023

(30) Foreign Application Priority Data
Oct. 28, 2020 (JP) ................... 2020-180866

(51) Int. Cl.
*G01D 5/245* (2006.01)
*G01R 33/09* (2006.01)
(52) U.S. Cl.
CPC ........... *G01D 5/245* (2013.01); *G01R 33/091* (2013.01)
(58) Field of Classification Search
CPC ................. G01D 5/245; G01R 33/091
See application file for complete search history.

(56) References Cited

U.S. PATENT DOCUMENTS

| | | | | |
|---|---|---|---|---|
| 6,160,395 A | * | 12/2000 | Goetz | G01B 7/023 324/207.21 |
| 2013/0218517 A1 | * | 8/2013 | Ausserlechner | G01B 7/30 324/207.13 |
| 2016/0282144 A1 | * | 9/2016 | Komasaki | H01F 7/0273 |

FOREIGN PATENT DOCUMENTS

| | | |
|---|---|---|
| JP | S58-106462 A | 6/1983 |
| JP | 2000-193407 A | 7/2000 |
| JP | 2019-134627 A | 8/2019 |

OTHER PUBLICATIONS

International Search Report dated Jan. 18, 2022 issued in International Patent Application No. PCT/JP2021/039549, with English translation.

* cited by examiner

*Primary Examiner* — Reena Aurora
(74) *Attorney, Agent, or Firm* — Rimon P.C.

(57) ABSTRACT

A position detection system includes a magnetic pole block and a magnetic sensor. The magnetic pole block includes a plurality of magnetic poles arranged in a first direction. The plurality of magnetic poles are arranged such that N poles and S poles are alternately arranged as the plurality of magnetic poles in the first direction. At least one member selected from the magnetic pole block and the magnetic sensor is movable in the first direction with respect to the other member. The magnetic sensor includes a plurality of magnetoresistive effect elements and a bias magnet. The plurality of magnetoresistive effect elements are arranged side by side in the first direction. The bias magnet applies, to the plurality of magnetoresistive effect elements, a magnetic field having an orientation toward one of two opposite sides of the first direction.

8 Claims, 13 Drawing Sheets

POSITION DETECTION SYSTEM

CROSS-REFERENCE OF RELATED APPLICATIONS

This application is the U.S. National Phase under 35 U.S.C. § 371 of International Patent Application No. PCT/JP2021/039549, filed on Oct. 26, 2021, which in turn claims the benefit of Japanese Patent Application No. 2020-180866, filed on Oct. 28, 2020, the entire disclosures of which Applications are incorporated by reference herein.

TECHNICAL FIELD

The present disclosure generally relates to a position detection system, and more particularly relates to a position detection system including a magnetic sensor.

BACKGROUND ART

Patent Literature 1 discloses a magnetic position detection device (position detection system) including a magnetic scale unit and a magnetic sensor unit. The magnetic scale unit is magnetized with magnetic information. The magnetic sensor unit is configured to move relative to the magnetic scale unit and thereby detect the magnetic information from the magnetic scale unit. The magnetic sensor unit includes a plurality of giant magnetoresistive effect elements and a bias magnet for applying a bias magnetic field to the giant magnetoresistive effect elements. The direction in which the magnetic scale unit is magnetized with the magnetic information is substantially perpendicular to a relative movement direction in which the magnetic sensor unit moves relative to the magnetic scale unit. The bias magnet is configured and arranged to apply bias magnetic fields in mutually different directions to the giant magnetoresistive effect elements that are substantially adjacent to each other.

In the magnetic position detection device (position detection system) of Patent Literature 1, however, the outputs of the giant magnetoresistive effect elements are not always sufficient linear with respect to the magnetic field strength, thus possibly making the position detection based on those outputs insufficiently accurate.

CITATION LIST

Patent Literature

Patent Literature 1: JP 2000-193407 A

SUMMARY OF INVENTION

It is an object of the present disclosure to provide a position detection system contributing to improving the position detection accuracy.

A position detection system according to an aspect of the present disclosure includes a magnetic pole block and a magnetic sensor. The magnetic pole block includes a plurality of magnetic poles that are arranged in a first direction. The magnetic sensor is arranged to face the plurality of magnetic poles in a second direction that intersects with the first direction. The plurality of magnetic poles are arranged such that N poles and S poles are alternately arranged as the plurality of magnetic poles in the first direction. At least one member selected from the group consisting of the magnetic pole block and the magnetic sensor is movable in the first direction with respect to the other member of the group. The magnetic sensor includes a plurality of magnetoresistive effect elements and a bias magnet. The plurality of magnetoresistive effect elements are arranged side by side in the first direction. The bias magnet applies, to the plurality of magnetoresistive effect elements, a magnetic field having an orientation toward one of two opposite sides of the first direction.

DESCRIPTION OF EMBODIMENTS

Embodiment

A position detection system 1 according to an exemplary embodiment will be described with reference to the accompanying drawings. Note that the embodiment to be described below is only an exemplary one of various embodiments of the present disclosure and should not be construed as limiting. Rather, the exemplary embodiment may be readily modified in various manners depending on a design choice or any other factor without departing from the scope of the present disclosure. The drawings to be referred to in the following description of embodiments are all schematic representations. Thus, the ratio of the dimensions (including thicknesses) of respective constituent elements illustrated on the drawings does not always reflect their actual dimensional ratio.

(Overview)

A position detection system 1 detects the position of a detection target using magnetism. The position detection system 1 may be used as, for example, a position sensor such as a linear encoder or a rotary encoder. More specifically, the position detection system 1 may be used as, for example, a position sensor (encoder) for detecting the position of a motor (such as a linear motor or a rotary motor) to drive a lens of a camera, for example. Alternatively, the position detection system 1 may also be used as, for example, a position sensor for detecting the position of a brake pedal, a brake lever, or a gear shift of an automobile. Still alternatively, the position detection system 1 may also be used as, for example a reader for reading a code written by a magnetic body. However, these are only exemplary uses of the position detection system 1 and should not be construed as limiting. As used herein, the "position" to be detected by the position detection system 1 is a concept encompassing both the coordinates of the detection target and the rotational angle defined by the detection target around a rotational axis (virtual axis) passing through the detection target (i.e., the orientation of the detection target). That is to say, the position detection system 1 detects at least one of the coordinates of the detection target or the rotational angle defined by the detection target.

In the following description, an embodiment in which the position detection system 1 is used as a rotary encoder will be described as an example. More specifically, the position detection system 1 according to this embodiment is an absolute rotary encoder.

Figure 1:
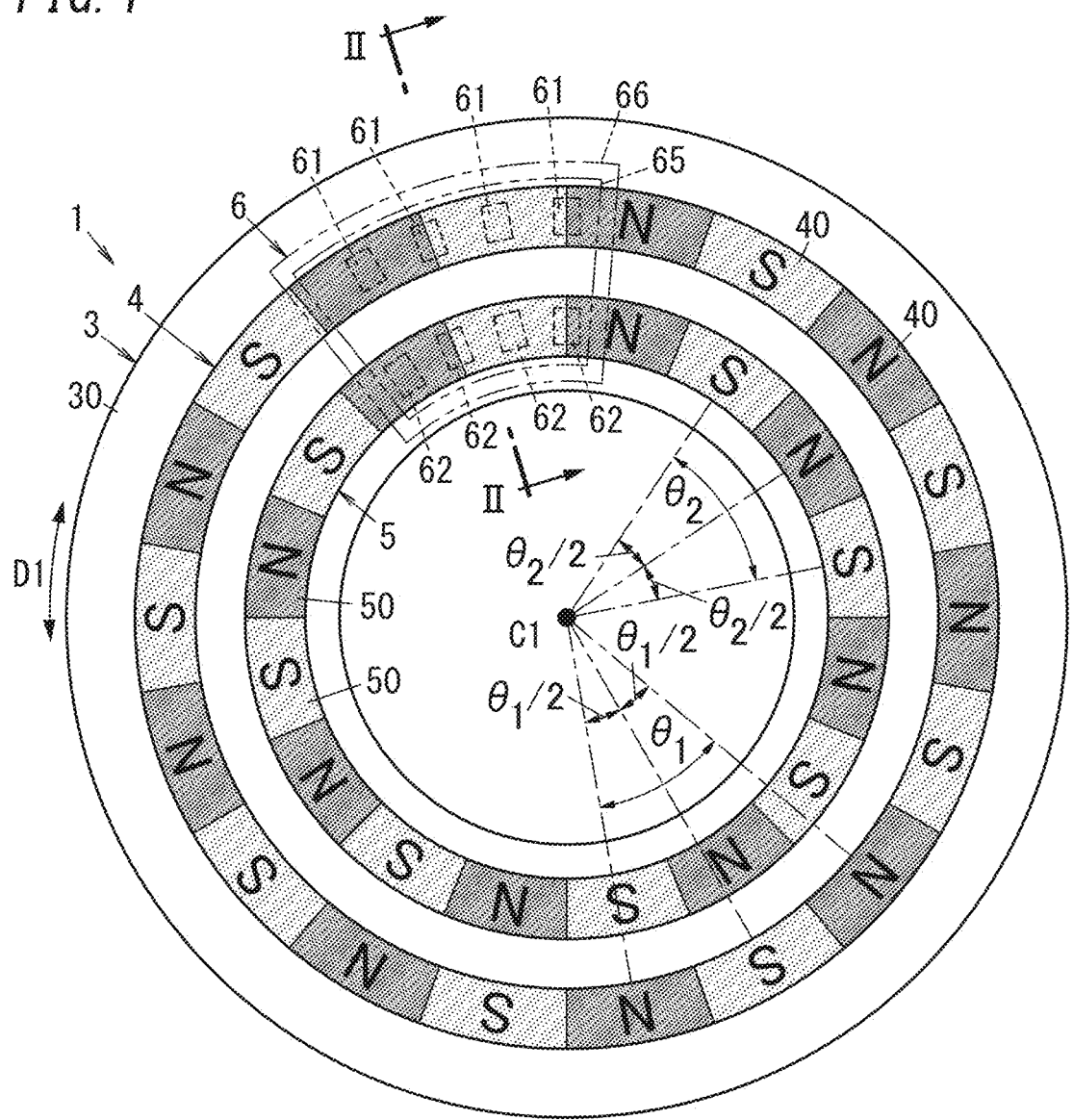
FIG. 1 is a plan view of a position detection system according to an exemplary embodiment.

As shown in FIG. 1, the position detection system 1 according to this embodiment includes a magnetic pole block 3 and a magnetic sensor 6. The magnetic pole block 3 includes a plurality of magnetic poles 40, 50 arranged in a first direction D1. The magnetic sensor 6 is arranged to face the plurality of magnetic poles 40, 50 in a second direction D2 (refer to FIG. 2) that intersects with the first direction D1. The plurality of magnetic poles 40, 50 are arranged such that N poles and S poles are alternately arranged as the plurality of magnetic poles 40, 50 in the first direction D1. At least one member selected from the group consisting of the magnetic pole block 3 and the magnetic sensor 6 is movable in the first direction D1 with respect to the other member of the group. The magnetic sensor 6 includes a plurality of magnetoresistive effect elements 61, 62 and a bias magnet 65. The plurality of magnetoresistive effect elements 61, 62 are arranged side by side in the first direction D1. The bias magnet 65 applies, to the plurality of magnetoresistive effect elements 61, 62, a magnetic field having an orientation toward one of the two opposite sides of the first direction D1.

According to this embodiment, the direction of the magnetic field applied from the bias magnet 65 to the plurality of magnetoresistive effect elements 61, 62 is aligned with the first direction D1 and is the same direction in each of the plurality of magnetoresistive effect elements 61, 62. This improves the linearity of the respective outputs of the magnetoresistive effect elements 61, 62 with respect to the strength of the magnetic field applied from the magnetic pole block 3 as will be described later. Consequently, this improves the position detection accuracy when the position of one member selected from the magnetic pole block 3 and the magnetic sensor 6 is going to be detected with respect to the other member. As used herein, the phrase "the strength of the magnetic field applied from the magnetic pole block 3" refers to the magnetic field applied to the magnetoresistive effect elements 61, 62 except the magnetic field generated from the bias magnet 65.

(Details)
(1) Overall Configuration

The position detection system 1 includes not only the magnetic pole block 3 and the magnetic sensor 6 described above but also a processing circuit 21 (refer to FIG. 4) as well. The processing circuit 21 determines, based on the respective outputs of the plurality of magnetoresistive effect elements 61, 62, the position of one member selected from the magnetic pole block 3 and the magnetic sensor 6 with respect to the other member.

In the following description, an embodiment in which the magnetic pole block 3, selected from the magnetic sensor 6 and the magnetic pole block 3, moves (rotates) in the first direction D1 with respect to the magnetic sensor 6 will be described as an example. That is to say, the magnetic pole block 3 according to this embodiment is either attached to, or assembled integrally with, the detection target, of which the position (rotational angle) needs to be detected.

Also, the position detection system 1 according to this embodiment is a rotary encoder, and therefore, the first direction D1 is the direction in which the rotational member selected from the magnetic sensor 6 and the magnetic pole block 3 (e.g., the magnetic pole block 3 in this embodiment) rotates.

(2) Magnetic Pole Block

The magnetic pole block 3 may have, for example, a circular, arc, or liner shape. Typical examples of the circular shapes include disklike, annular, and elliptical shapes. Typical examples of the arc shapes include circular and elliptical arc shapes. In the following description, an embodiment in which the magnetic pole block 3 has an annular shape will be described as an example.

As shown in FIG. 1, the magnetic pole block 3 includes a first track 4, a second track 5, and a base member 30. The first track 4 includes a first number of magnetic poles 40 and the second track 5 includes a second number of magnetic poles 50. Each of these magnetic poles 40, may be a ferrite magnet, for example.

In FIG. 1 and other drawings, each of the N-magnetic poles is labeled as "N" and each of the S-magnetic poles is labeled as "S." In addition, the N- and S-magnetic poles have different shades to be easily distinguishable from each other. Note that the letters "N" and "S" and the shades are shown on the drawings for illustrative purposes only and actually the magnetic poles do not have such inscribed letters or shaded in such colors.

The base member 30 is formed in a sheet shape. When viewed in a thickness direction defined for the base member 30, the base member 30 has a circular shape (more specifically, an annular shape). Each of the first track 4 and the second track 5 is formed by, for example, printing magnetic ink on the base member 30. When viewed in the thickness direction defined for the base member 30, each of the first track 4 and the second track 5 has a circular shape (more specifically, an annular shape). The base member 30, the first track 4, and the second track 5 are formed in concentric shapes. That is to say, the respective centers of the base member 30, the first track 4, and the second track 5 agree with each other and will be hereinafter simply referred to as either "the center C1" or the "center C1 of the magnetic pole block 3." The magnetic pole block 3 rotates around the center C1.

The first track 4 includes a first number (which is an even number and may be eighteen in FIG. 1) of magnetic poles 40 arranged side by side in the first direction D1. The respective lengths of the first number of magnetic poles 40 as measured in the first direction D1 are equal to each other. The first number of magnetic poles 40 are arranged such that N poles and S poles are alternately arranged as the first number of magnetic poles 40 in the first direction D1.

The second track 5 includes a second number (which is an even number and may be sixteen in FIG. 1) of magnetic poles 50 arranged side by side in the first direction D1. The respective lengths of the second number of magnetic poles 50 as measured in the first direction D1 are equal to each other. The second number of magnetic poles 50 are arranged such that N poles and S poles are alternately arranged as the second number of magnetic poles 50 in the first direction D1. The diameter of the second track 5 is shorter than the diameter of the first track 4.

The first direction D1 is the rotational direction of the magnetic pole block 3. Thus, the first number of magnetic poles 40 on the first track 4 are arranged side by side in the rotational direction to form a circle. The second number of magnetic poles 50 on the second track 5 are arranged side by side to form another circle which is concentric with the circle of the first track 4.

One number selected from the first number and the second number is greater by two than the other member. In this embodiment, the first number (eighteen) is greater by two than the second number (sixteen).

The interval $\theta_1$ between magnetic poles 40 having the same polarity and included in the first number of magnetic poles 40 is different from the interval $\theta_2$ between magnetic poles 50 having the same polarity and included in the second number of magnetic poles 50. In this case, if the first direction D1 is the rotational direction as in this embodiment, the interval $\theta_1$ is defined as an angular difference formed between magnetic poles 40 having the polarity with respect to the center C1. That is to say, the angle formed between a line segment connecting the middle of one S-magnetic pole (or N-magnetic pole) 40 on the first track 4 to the center C1 and a line segment connecting the middle of the next S-magnetic pole (or N-magnetic pole) 40 on the first track 4 to the center C1 is defined as the interval $\theta_1$. In the same way, the angle formed between a line segment connecting the middle of one S-magnetic pole (or N-magnetic pole) 50 on the second track 5 to the center C1 and a line segment connecting the middle of the next S-magnetic pole (or N-magnetic pole) 50 on the second track 5 to the center C1 is defined as the interval $\theta_2$.

Figure 13:
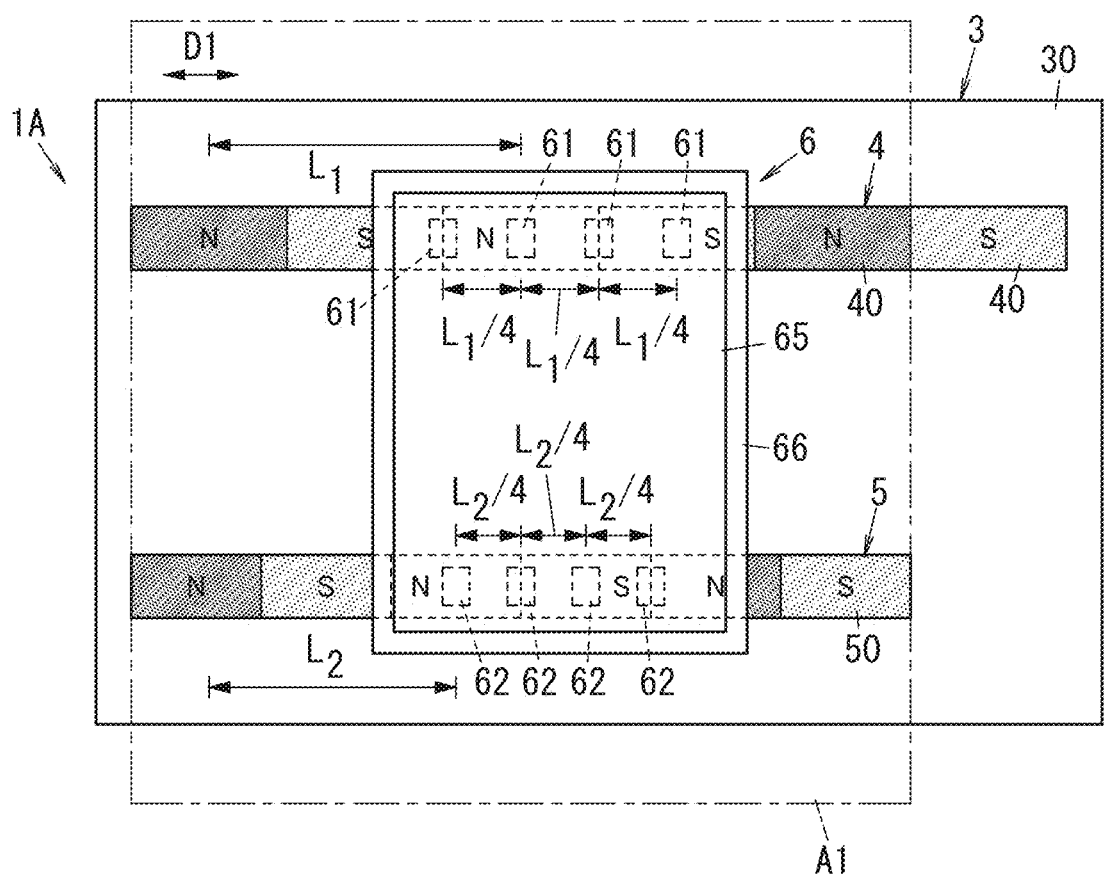
FIG. 13 is a plan view of a position detection system according to a first variation.

Note that if the first direction D1 that is the direction in which the first number of magnetic poles 40 are arranged side by side and the direction in which the second number of magnetic poles are arranged side by side is a linear direction as in FIG. 13 to be referred to later, then the intervals $\theta_1$, $\theta_2$ may be defined in the following manner. Specifically, the linear distance between the middle of one S-magnetic pole (or N-magnetic pole) 40 on the first track 4 and the middle of the next S-magnetic pole (or N-magnetic pole) 40 on the first track 4 may be defined as the interval $\theta_1$ and the linear distance between the middle of one S-magnetic pole (or N-magnetic pole) 50 on the second track 5 and the middle of the next S-magnetic pole (or N-magnetic pole) 50 on the second track 5 may be defined as the interval $\theta_2$.

As shown in FIG. 1, the interval between each pair of adjacent magnetic poles 40 in the first number of magnetic poles 40 is one-half of the interval $\theta_1$. That is to say, the interval between the middle of each N-magnetic pole 40 and the middle of an S-magnetic pole 40 adjacent to the N-magnetic pole 40 is one-half of the interval $\theta_1$. In the same way, the interval between each pair of adjacent magnetic poles 50 in the second number of magnetic poles 50 is one-half of the interval $\theta_2$.

(3) Magnetic Sensor
(3-1) Overview of Magnetic Sensor

As shown in FIG. 1, the magnetic sensor 6 includes a plurality of (e.g., four in FIG. 1) (first) magnetoresistive effect elements 61 and a plurality of (e.g., four in FIG. 1) (second) magnetoresistive effect elements 62. The plurality of magnetoresistive effect elements 61 are arranged side by side in the first direction D1 to detect the magnetism generated on the first track 4. The plurality of magnetoresistive effect elements 62 are arranged side by side in the first direction D1 to detect the magnetism generated on the second track 5. Each of these magnetoresistive effect elements 61, 62 detects magnetism (magnetic field) in the first direction D1. The plurality of magnetoresistive effect elements 61 and the plurality of magnetoresistive effect elements 62 may be housed in a single package, for example.

Figure 2:
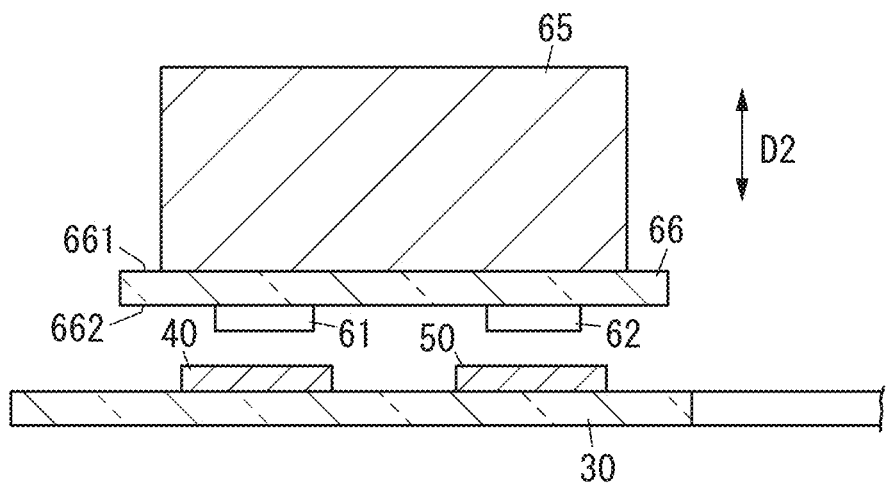
FIG. 2 is a cross-sectional view of the position detection system as taken along the plane II-II shown in FIG. 1.

The magnetic sensor 6 further includes the bias magnet 65 and a sensor board 66. The sensor board 66 is a holding member for holding the plurality of magnetoresistive effect elements 61, 62. The sensor board 66 according to this embodiment is implemented as a printed wiring board. As shown in FIG. 2, the sensor board 66 has a first principal surface 661 and a second principal surface 662. The second principal surface 662 is opposite from the first principal surface 661 in the thickness direction defined for the sensor board 66. The bias magnet 65 is disposed on the first principal surface 661. The plurality of magnetoresistive effect elements 61, 62 are arranged on the second principal surface 662. The second principal surface 662 faces the plurality of magnetic poles 40, 50.

(3-2) Magnetoresistive Effect Element
(3-2-1) Arrangement

As shown in FIG. 1, the plurality of (first) magnetoresistive effect elements 61 are arranged to face the first number of magnetic poles 40 on the first track 4. The direction in which the plurality of magnetoresistive effect elements 61 faces the first number of magnetic poles 40 is aligned with the rotational axis of the magnetic pole block 3. As the magnetic pole block 3 rotates, the magnetic pole 40 that each magnetoresistive effect element 61 faces changes from one of the first number of magnetic poles 40 to another.

The plurality of (second) magnetoresistive effect elements 62 are arranged to face the second number of magnetic poles 50 on the second track 5. The direction in which the plurality of magnetoresistive effect elements 62 faces the second number of magnetic poles 50 is aligned with the rotational axis of the magnetic pole block 3. As the magnetic pole block 3 rotates, the magnetic pole 50 that each magnetoresistive effect element 62 faces changes from one of the second number of magnetic poles 50 to another.

Figure 3A:
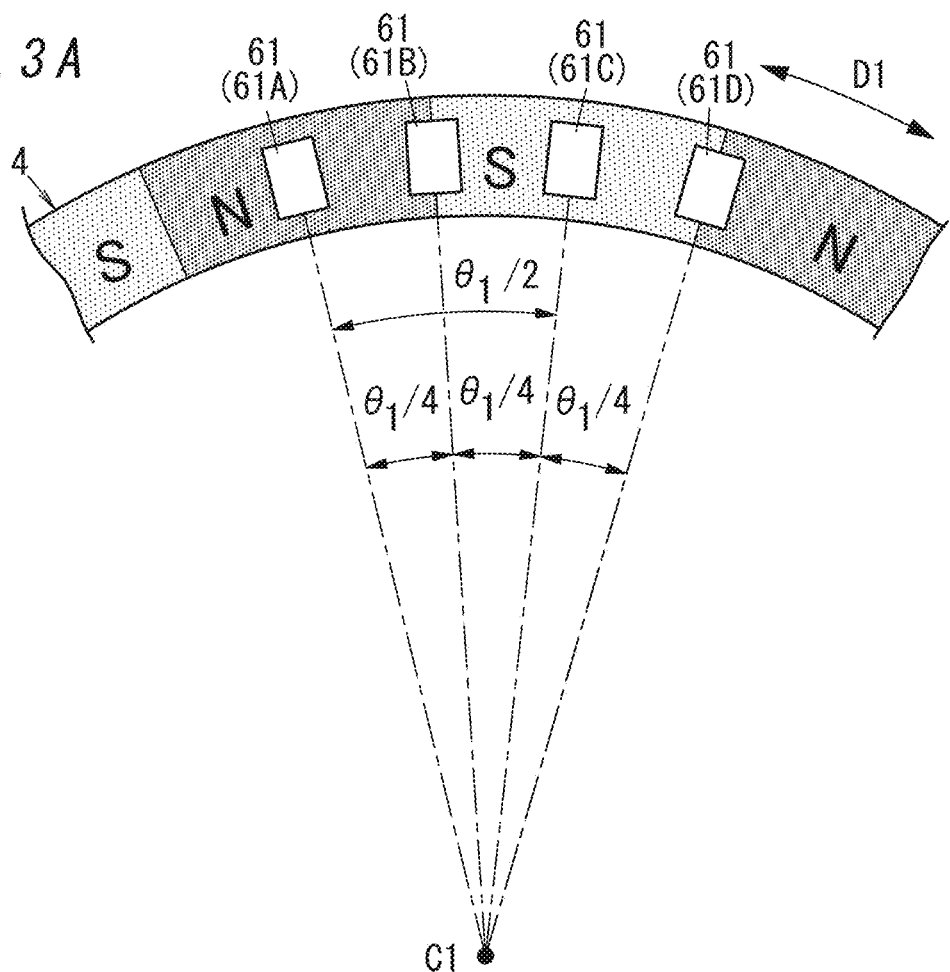
FIGS. 3A and 3B are schematic representations illustrating a main part of the position detection system.
Figure 3B:
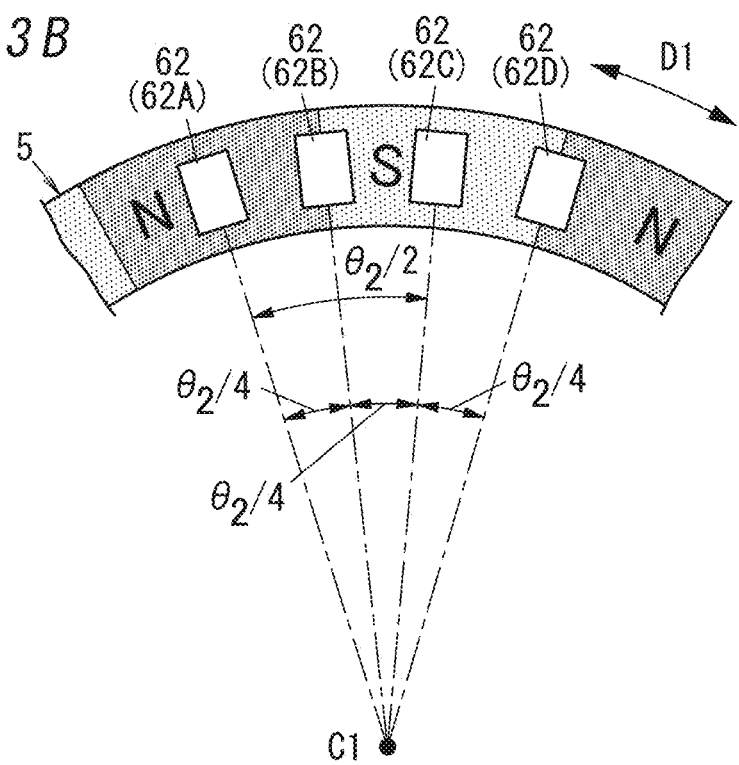

FIG. 3A schematically shows the relative positions of the plurality of magnetoresistive effect elements 61 with respect to the first track 4. FIG. 3B schematically shows the relative positions of the plurality of magnetoresistive effect elements 62 with respect to the second track 5.

In the following description, when the plurality of magnetoresistive effect elements 61 need to be distinguished from each other, the plurality of magnetoresistive effect elements 61 will be hereinafter sometimes designated by the reference signs 61A, 61B, 61C, 61D, and so on. Likewise, when the plurality of magnetoresistive effect elements 62 need to be distinguished from each other, the plurality of magnetoresistive effect elements 62 will be hereinafter sometimes designated by the reference signs 62A, 62B, 62C, 62D, and so on. The plurality of magnetoresistive effect elements 61A, 61B, 61C, 61D are arranged side by side in this order in the first direction D1. The plurality of magnetoresistive effect elements 62A, 62B, 62C, 62D are also arranged side by side in this order in the first direction D1.

The plurality of (first) magnetoresistive effect elements 61 includes two magnetoresistive effect elements 61A, 61C arranged at an interval that is one half of the interval $\theta_1$ between the magnetic poles 40 having the same polarity and included in the first number of magnetic poles 40 on the first track 4. The plurality of (second) magnetoresistive effect elements 62 includes two magnetoresistive effect elements 62A, 62C arranged at an interval that is one half of the interval 2 between the magnetic poles 50 having the same polarity and included in the second number of magnetic poles 50 on the second track 5.

In this case, the interval between each pair of magnetoresistive effect elements 61 (or 62) may be defined in the same way as the interval $\theta_1$ between the magnetic poles 40 having the same polarity and included in the first number of magnetic poles 40 and the interval $\theta_2$ between the magnetic poles 50 having the same polarity and included in the second number of magnetic poles That is to say, if the first direction D1 is the rotational direction as in this embodiment, the interval between each pair of magnetoresistive effect elements 61 (or 62) is defined to be an angular difference formed between the respective middles of the two magnetoresistive effect elements 61 (or 62) with respect to the center C1.

Alternatively, if the first direction D1 in which the first number of magnetic poles 40 are arranged side by side and in which the second number of magnetic poles 50 are arranged side by side is a linear direction as in FIG. 13 to be referred to later, then the interval between each pair of magnetoresistive effect elements 61 (or 62) may be defined to be the linear distance between their respective middles.

The four magnetoresistive effect elements 61A-61D over the first track 4 are arranged in this order in the first direction D1 and the interval between each pair of adjacent magnetoresistive effect elements 61 is one quarter of the interval $\theta_1$.

The four magnetoresistive effect elements 62A-62D over the second track 5 are arranged in this order in the first direction D1 and the interval between each pair of adjacent magnetoresistive effect elements 62 is one quarter of the interval $\theta_2$.

Figure 4:
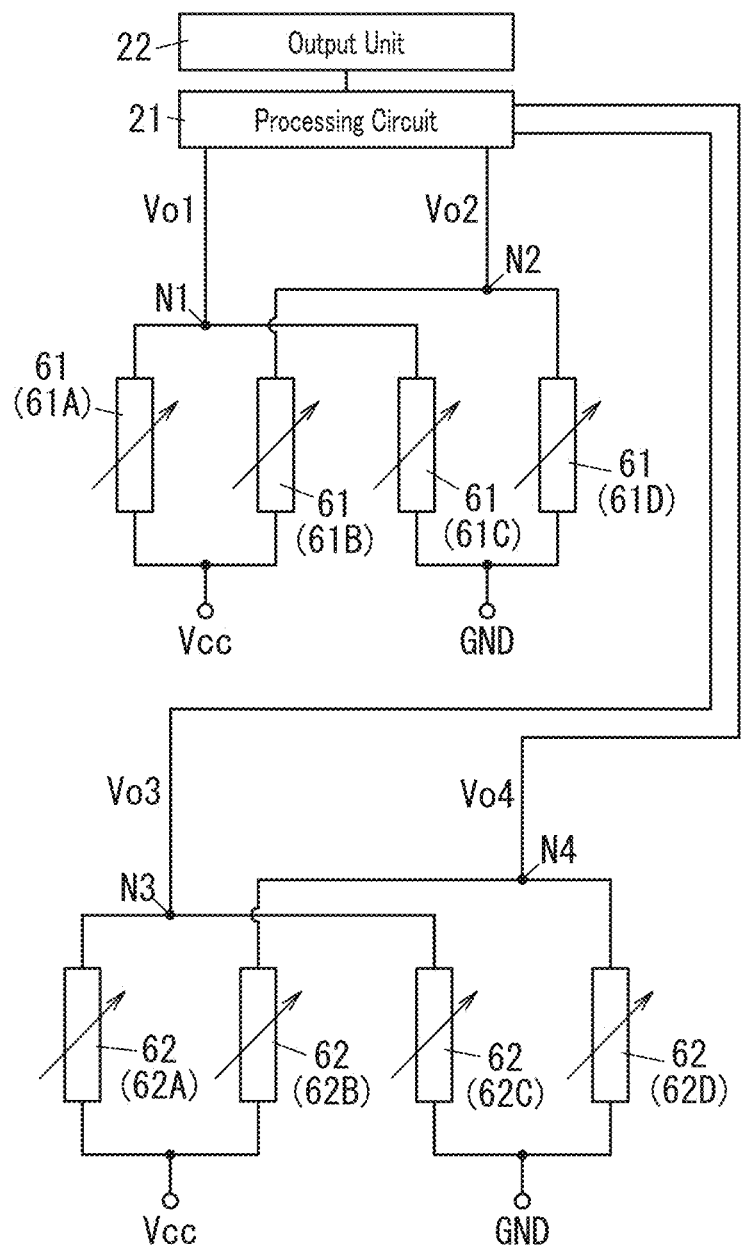
FIG. 4 is a circuit block diagram of the position detection system.

FIG. 4 is a block diagram of a circuit including four magnetoresistive effect elements 61 and four magnetoresistive effect elements 62.

The four magnetoresistive effect elements 61 are bridge-connected to each other. That is to say, two series circuits, each consisting of two magnetoresistive effect elements 61, are connected between a power supply Vcc and the ground GND. The two series circuits are connected to each other in parallel. A first voltage Vo1 is output from a node N1 between the two magnetoresistive effect elements 61A, 61C that form one of the two series circuits. A second voltage Vo2 is output from a node N2 between the two magnetoresistive effect elements 61B, 61D that form the other of the two series circuits.

The four magnetoresistive effect elements 62 are bridge-connected to each other. That is to say, two series circuits, each consisting of two magnetoresistive effect elements 62, are connected between the power supply Vcc and the ground GND. The two series circuits are connected to each other in parallel. A third voltage Vo3 is output from a node N3 between the two magnetoresistive effect elements 62A, 62C that form one of the two series circuits. A fourth voltage Vo4 is output from a node N4 between the two magnetoresistive effect elements 62B, 62D that form the other of the two series circuits.

Figure 7:
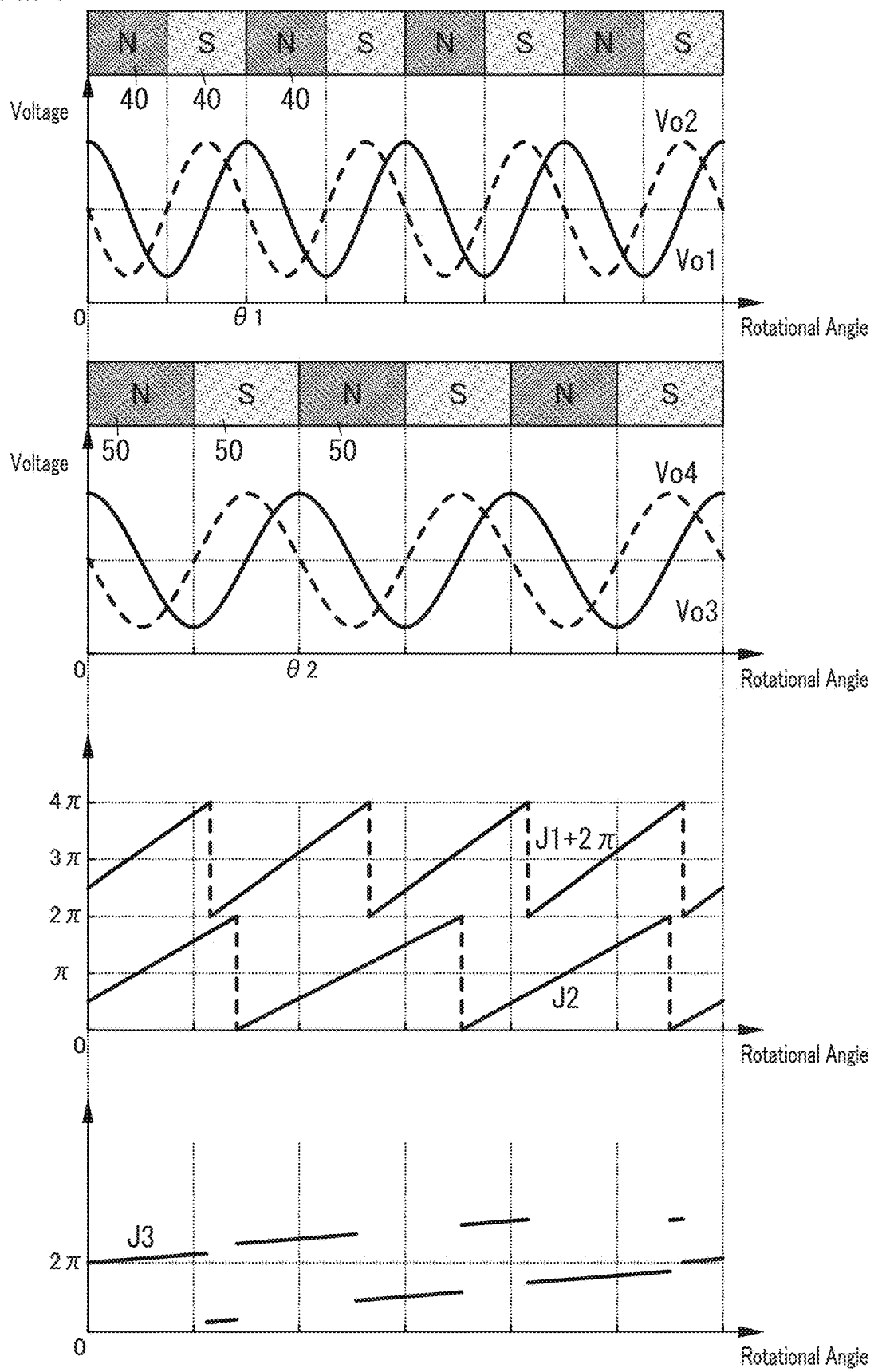
FIG. 7 illustrates signals to be processed by the position detection system.

In the orthogonal coordinate systems shown on the uppermost and second uppermost portions of FIG. 7, a coordinate axis (i.e., the axis of abscissas) indicating the rotational angle of the magnetic pole block 3 with respect to the magnetic sensor 6 and a coordinate axis (i.e., the axis of ordinates) indicating the first voltage Vo1, the second voltage Vo2, the third voltage Vo3, and the fourth voltage Vo4 intersect with each other at right angles. In this orthogonal coordinate system, the respective waveforms of the first voltage Vo1, the second voltage Vo2, the third voltage Vo3, and the fourth voltage Vo4 are sinusoidal (or cosine) waveforms. As the rotational angle defined by the magnetic pole block 3 with respect to the magnetic sensor 6 changes, the first voltage Vo1, the second voltage Vo2, the third voltage Vo3, and the fourth voltage Vo4 also vary. The cycle of the first voltage Vo1 and the second voltage Vo2 is equal to the interval $\theta_1$ and the cycle of the third voltage Vo3 and the fourth voltage Vo4 is equal to the interval $\theta_2$.

As described above, the interval between each pair of adjacent magnetoresistive effect elements 61 is one quarter of the interval $\theta_1$. According to such an arrangement, the phases of the first voltage Vo1 and the second voltage Vo2 shift from each other by one quarter of the interval $\theta_1$. That is to say, the second voltage Vo2 corresponds to a cosine wave having the same phase as the first voltage Vo1 having the sinusoidal waveform. Likewise, the phases of the third voltage Vo3 and the fourth voltage Vo4 shift from each other by one quarter of the interval $\theta_2$. That is to say, the fourth voltage Vo4 corresponds to a cosine wave having the same phase as the third voltage Vo3 having the sinusoidal waveform.

As shown in FIG. 4, the first voltage Vo1, the second voltage Vo2, the third voltage Vo3, and the fourth voltage Vo4 are supplied to the processing circuit 21. The processing circuit 21 determines, based on the first voltage Vo1, the second voltage Vo2, the third voltage Vo3, and the fourth voltage Vo4, the position (rotational angle) of the magnetic pole block 3 with respect to the magnetic sensor 6. The processing to be performed by the processing circuit 21 will be described in detail later.

(3-2-2) Structure of Magnetoresistive Effect Elements

Each of the plurality of magnetoresistive effect elements 61, 62 is a giant magnetoresistive effect (GMR) element. The GMR elements include a current-in-plane (CIP) type and a current-perpendicular-to-plane (CPP) type. The magnetoresistive effect elements 61, 62 according to this embodiment are CIP type GMR elements.

Next, the structure of the magnetoresistive effect elements 61 will be described with reference to FIG. 5. Note that the magnetoresistive effect elements 62 have the same structure as the magnetoresistive effect elements 61, and therefore, the following description applies to the magnetoresistive effect elements 62 as well.

Figure 5:
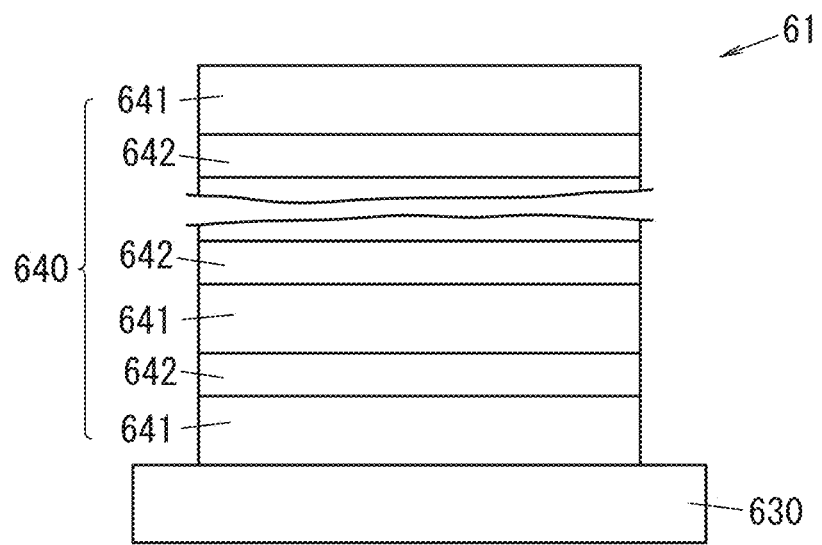
FIG. 5 is a schematic representation illustrating a magnetoresistive effect element of the position detection system.

FIG. 5 is a schematic representation illustrating a magnetoresistive effect element 61. The magnetoresistive effect element 61 includes a substrate 630 and a multilayer structure 640 formed on the substrate 630. The substrate 630 may be a silicon substrate, for example. The substrate 630 may be shared by the plurality of magnetoresistive effect elements 61. The multilayer structure 640 may contain, for example, cobalt (Co) and iron (Fe).

More specifically, the multilayer structure 640 is a laminate of multiple metal layers. Each metal layer has a thickness on the order of several nm. Several tens of atoms are stacked one on top of another in each layer in the thickness direction defined for the layer.

The multilayer structure 640 includes magnetic layers 641 and nonmagnetic layers 642. The multilayer structure 640 is formed by alternately stacking the magnetic layers 641 and the nonmagnetic layers 642 one on top of another. That is to say, the multilayer structure 640 has a spin valve structure. The number of layers that form the multilayer structure 640 may be, for example, equal to or greater than 10 or equal to or greater than 20. Each of the magnetic layers 641 is a layer of a ferromagnetic material. The magnetic layers 641 are magnetizable more easily than the nonmagnetic layers 642.

The magnetic layers 641 preferably contain cobalt (Co), for example. The magnetic layers 641 may further contain iron (Fe). In the magnetic layers 641, a composition ratio of Co is preferably equal to or greater than 20%. For example, in the magnetic layers 641, the composition ratio of Co may be equal to the composition ratio of Fe. Each of the nonmagnetic layers 642 is a layer of a nonmagnetic material. The nonmagnetic layers 642 preferably contain copper (Cu). Alternatively, the nonmagnetic layers 642 may contain, for example, silver (Ag), gold (Au), platinum (Pt), or ruthenium (Ru), instead of Cu.

In the known art, nickel (Ni) is sometimes adopted as a constituent magnetic material for the magnetic layers 641 of the multilayer structure 640. However, it is preferable that the multilayer structure 640 contain no Ni. The reason is that when the multilayer structure 640 is exposed to heat, Ni would diffuse into Cu, for example, included in the multilayer structure 640, thus possibly making it impossible to maintain the multilayer structure 640. Adding no Ni to the multilayer structure 640 may increase the heat resistance of the multilayer structure 640 (magnetic sensor 6). In addition, using Co and Fe as constituent materials for the magnetic layers 641 may make the output of the magnetoresistive effect elements 61 relatively high. It is preferable that the magnetic layers 641 consist essentially of Co and Fe.

Furthermore, using Cu as a constituent material for the nonmagnetic layers 642 may make the output of the magnetoresistive effect elements 61 relatively high. In addition, this may also make the hysteresis of the variation in the electrical resistance of the magnetoresistive effect elements 61 relatively small in response to a variation in magnetism. It is preferable that the nonmagnetic layers 642 consist essentially of Cu.

(3-3) Bias Magnet

As the bias magnet 65 (refer to FIGS. 1 and 2), either a permanent magnet or an electromagnet may be adopted, for example. The bias magnet 65 according to this embodiment is made up of a plurality of permanent magnets which are arranged side by side in the first direction D1 (refer to FIG. 6). The permanent magnets that form the bias magnet 65 are preferably the same type of permanent magnets as the magnetic poles 40, 50 of the magnetic pole block 3. For example, if the magnetic poles 40, 50 are ferrite magnets, then the permanent magnets of the bias magnet 65 are also preferably ferrite magnets.

The bias magnet 65 has been magnetized in the first direction D1. The bias magnet 65 is arranged to overlap with the plurality of magnetoresistive effect elements 61, 62 in a direction perpendicular to the first direction D1 (i.e., in the direction parallel to the rotational axis of the magnetic pole block 3). The distance from the middle of a region where the plurality of magnetoresistive effect elements 61 are arranged (i.e., a midpoint between the magnetoresistive effect elements 61B, 61C) to a first end of the bias magnet 65 in the first direction D1 is as long as the distance from the middle of the region to a second end of the bias magnet 65 in the first direction D1 (i.e., the other end opposite from the first end). Likewise, the distance from the middle of a region where the plurality of magnetoresistive effect elements 62 are arranged (i.e., a midpoint between the magnetoresistive effect elements 62B, 62C) to the first end of the bias magnet 65 in the first direction D1 is as long as the distance from the middle of the region to the second end of the bias magnet 65 in the first direction D1.

Figure 6:
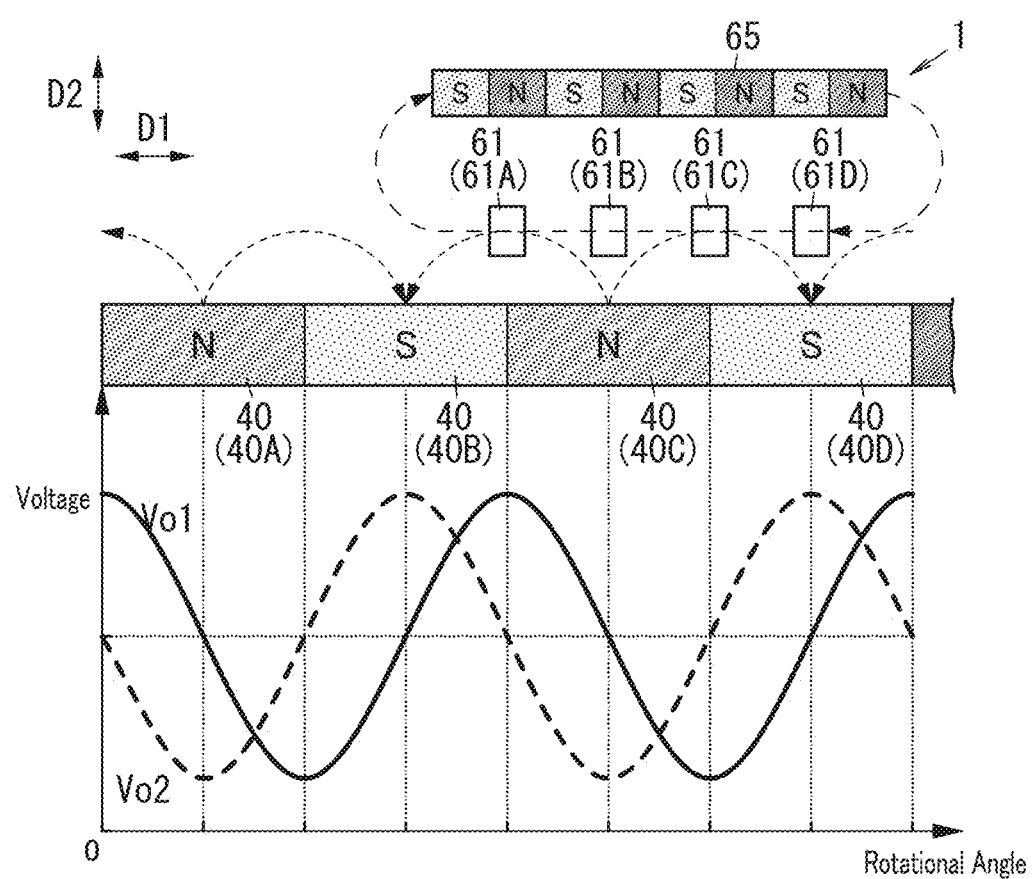
FIG. 6 illustrates a signal to be processed by the position detection system.

The dashed arrows extended from the bias magnet 65 shown in FIG. 6 indicate a magnetic field formed by the bias magnet 65. The bias magnet 65 applies, to the plurality of magnetoresistive effect elements 61, 62, a magnetic field having an orientation toward one of two opposite sides of the first direction D1 (refer to FIG. 6). That is to say, supposing the orientation of the magnetic field applied from the bias magnet 65 to one of the plurality of magnetoresistive effect elements 61, 62 is the clockwise direction in FIG. 1, the orientation of the magnetic field applied from the bias magnet 65 to the other magnetoresistive effect elements is also the clockwise direction in FIG. 1.

In FIG. 1, the bias magnet 65 is illustrated as having a circular arc shape. Note that the number of the magnetic poles 40, 50 illustrated on the drawings is smaller (i.e., the length of the magnetic poles 40, 50 as measured in the first direction D1 is illustrated to be greater) than the real one for the sake of convenience of description. Actually, the number of the magnetic poles 40 provided may be, for example, a few hundred. Thus, the interval between the plurality of magnetoresistive effect elements 61 (or 62) is actually shorter than the illustrated one and the direction in which the plurality of magnetoresistive effect elements 61 (or 62) are arranged may be regarded as a linear direction. Therefore, the bias magnet 65 may be formed in the shape of a rectangular parallelepiped, of which the longitudinal axis is aligned with the first direction D1. Also, the length of the real bias magnet 65 as measured in the magnetization direction (i.e., in the first direction D1) is approximately ten times as long as the length of the magnetic poles 40, 50 as measured in the first direction D1. Thus, the orientation of the magnetic field applied from the bias magnet 65 to the plurality of magnetoresistive effect elements 61, 62 is substantially parallel to the magnetization direction of the bias magnet 65.

(4) Processing Circuit

The processing circuit 21 (refer to FIG. 4) includes a computer system including one or more processors and one or more memories. At least some functions of the processing circuit 21 are performed by making the processor of the computer system execute a program stored in the memory of the computer system. The program may be stored in the memory. The program may also be downloaded via a telecommunications line such as the Internet or distributed after having been stored in a non-transitory storage medium such as a memory card.

The processing circuit 21 determines, based on the first voltage Vo1, second voltage Vo2, third voltage Vo3, and fourth voltage Vo4 as the outputs of the magnetic sensor 6, the position (rotational angle) of the magnetic pole block 3 with respect to the magnetic sensor 6. This respect will be described with reference to FIGS. 6 and 7. In the following description to be given with reference to FIGS. 6 and 7, the first number is supposed to be eight and the second number is supposed to be six for the sake of simplicity of description. In addition, in FIGS. 6 and 7, the plurality of magnetic poles 40 and the plurality of magnetic poles 50 are illustrated as linear ones for the sake of convenience.

Each magnetoresistive effect element 61, 62 detects a magnetic field having an orientation toward one of the two opposite sides (hereinafter referred to as a "first side") of the first direction D1 and a magnetic field having an orientation toward the other of the two opposite sides (hereinafter referred to as a "second side") of the first direction D1. If the magnetic field having an orientation toward the first side and the magnetic field having an orientation toward the second side have magnetic field strengths with the same absolute value, then an output of each magnetoresistive effect element 61, 62 corresponding to the magnetic field with the orientation toward the first side and an output thereof corresponding to the magnetic field with the orientation toward the second side are the same output.

In the following description, when the four magnetic poles 40 shown in FIG. 6 need to be distinguished from each other, the four magnetic poles 40 will be hereinafter sometimes designated by the reference signs 40A, 40B, 40C, and 40D, respectively. The magnetic poles 40A, 40B, 40C, 40D are arranged side by side in this order in the first direction D1. The dashed arrows connected to the magnetic poles 40A, 40B, 40C, 40D shown in FIG. 6 indicate a magnetic field formed by the magnetic poles 40A, 40B, 40C, 40D.

In FIGS. 6 and 7, the position and rotational angle (on the axis of abscissas) of each magnetoresistive effect element 61A (or 62A) are shown to correspond to each other in the upward/downward direction on the paper sheet. For example, if the magnetoresistive effect element 61A is located at the left end of the magnetic poles 40A, then the first voltage Vo1 and the second voltage Vo2 have values when the rotational angle is 0 degrees.

As shown in FIG. 6, when the magnetoresistive effect element 61A is located between the respective middles of the S-magnetic pole 40B and the N-magnetic pole 40C, the orientation of the magnetic field generated from the plurality of magnetic poles 40 is leftward at the position of the magnetoresistive effect element 61A. Also, at this time, at the position of the magnetoresistive effect element 61C, the orientation of the magnetic field generated from the plurality of magnetic poles 40 is rightward. The (leftward) orientation of the magnetic field generated by the bias magnet 65 agrees with the orientation of the magnetic field generated from the plurality of magnetic poles 40 at the position of the magnetoresistive effect element 61A but is opposite from the orientation of the magnetic field generated from the plurality of magnetic poles 40 at the position of the magnetoresistive effect element 61C. This increases the magnetic field detected by the magnetoresistive effect element 61A and decreases the magnetic field detected by the magnetoresistive effect element 61C, compared to a situation where no bias magnet 65 is provided.

The voltage across each magnetoresistive effect element 61 is proportional to the magnetic field applied. The first voltage Vo1 is proportional to a value calculated by subtracting the voltage across the magnetoresistive effect element 61C from the voltage across the magnetoresistive effect element 61A. Thus, if the magnetoresistive effect element 61A is located between the respective middles of the S-magnetic pole 40B and the N-magnetic pole 40C as shown in FIG. 6, then the first voltage Vo1 comes to have a maximum value. On the other hand, if the magnetoresistive effect element 61A is located between the respective middles of the N-magnetic pole 40C and the S-magnetic pole 40D, for example, then the first voltage Vo1 comes to have a minimum value.

In the same way, the second voltage Vo2 is proportional to a value calculated by subtracting the voltage across the magnetoresistive effect element 61D from the voltage across the magnetoresistive effect element 61B. The third voltage Vo3 is proportional to a value calculated by subtracting the voltage across the magnetoresistive effect element 62C from the voltage across the magnetoresistive effect element 62A. The fourth voltage Vo4 is proportional to a value calculated by subtracting the voltage across the magnetoresistive effect element 62D from the voltage across the magnetoresistive effect element 62B.

To detect an absolute rotational angle of the magnetic pole block 3 with respect to the magnetic sensor 6, first, the processing circuit 21 calculates a first decision value J1 (refer to FIG. 7) by the following equations (1). Next, the processing circuit 21 calculates a second decision value J2 (refer to FIG. 7) by the following equations (2). The first decision value J1 corresponds to a common phase between the first voltage Vo1 as a sinusoidal wave and the second voltage Vo2 as a cosine wave. The second decision value J2 corresponds to a common phase between the third voltage Vo3 as a sinusoidal wave and the fourth voltage Vo4 as a cosine wave.

$J1=\arctan(Vo1/Vo2)$ (if $Vo1 \geq 0$ and $Vo2>0$), $J1=\arctan(Vo1/Vo2)+\pi$ (if $Vo2<0$), $J1=\arctan(Vo1/Vo2)+2\pi$ (if $Vo1<0$ and $Vo2>0$), $J1=\pi/2$ (if $Vo1>0$ and $Vo2=0$), or $J1=3\pi/2$ (if $Vo1<0$ and $Vo2=0$) (1)

$J2=\arctan(Vo3/Vo4)$ (if $Vo3 \geq 0$ and $Vo4>0$), $J2=\arctan(Vo3/Vo4)+\pi$ (if $Vo4<0$), $J2=\arctan(Vo3/Vo4)+2\pi$ (if $Vo3<0$ and $Vo4>0$), $J2=\pi/2$ (if $Vo3>0$ and $Vo4=0$), or $J2=3\pi/2$ (if $Vo3<0$ and $Vo4=0$) (2)

As shown in FIG. 7, in an orthogonal coordinate system, of which the abscissa indicates the rotational angle and the ordinate indicates the first decision value J1 and the second decision value J2, the first decision value J1 and the second decision value J2 each have a sawtooth waveform. More specifically, as the rotational angle varies, the first decision value J1 and the second decision value J2 change linearly. Then, the same waveform will be repeated for each pair of magnetic poles. That is to say, the cycle of the first decision value J1 agrees with the interval $\theta_1$ between magnetic poles 40 having the same polarity and included in the first number of magnetic poles 40 and the cycle of the second decision value J2 agrees with the interval $\theta_2$ between magnetic poles 50 having the same polarity and included in the second number of magnetic poles 50.

The processing circuit 21 further calculates, as a third decision value J3, a value corresponding to the difference between the first decision value J1 and the second decision value J2. The third decision value J3 may be calculated by, for example, the following equation (3):

$J3=J1-J2+2\pi$ (3)

In FIG. 7, the difference between (J1+2π) and the second decision value J2 is equal to the third decision value J3. In the example described above, the third decision value J3 is calculated by equation (3) for the sake of simplicity of description. Actually, however, the third decision value J3 may also be calculated by the following equation (4):

$J3=J1-J2$ (4)

The processing circuit 21 may calculate the third decision value J3 by either the equation (3) or the equation (4). Depending on whether the third decision value J3 is calculated by the equation (3) or the equation (4), an arithmetic expression or a data table, for example, showing the relation between the third decision value J3 and the rotational angle of the magnetic pole block 3 may be set as appropriate.

As shown in FIG. 7, the third decision value J3 varies according to the magnitude of the rotational angle of the magnetic pole block 3. This allows the processing circuit 21 to determine, based on the third decision value J3, the absolute rotational angle of the magnetic pole block 3 with respect to the magnetic sensor 6.

The processing circuit 21 may store, in a memory, the relation between the third decision value J3 and the rotational angle of the magnetic pole block 3 in the form of an arithmetic expression or a data table, for example. The processing circuit 21 may determine the rotational angle of the magnetic pole block 3 based on the third decision value J3 by the arithmetic expression or by reference to the data table. That is to say, the processing circuit 21 may, as shown in the lowermost graph in FIG. 7, transform the third decision value J3 indicated by the axis of ordinates into the rotational angle indicated by the axis of abscissas.

(5) Output Unit

The position detection system 1 preferably further includes an output unit 22 (refer to FIG. 4). The output unit 22 outputs position information indicating the position (rotational angle) of the magnetic pole block 3 that has been determined by the processing circuit 21. The output unit 22 may, for example, output the position information to a memory provided inside or outside the position detection system 1 and have the position information stored in the memory. Alternatively, the output unit 22 may output the position information to a presentation unit such as a display or a loudspeaker provided inside or outside the position detection system 1 and make the presentation unit present the position information either as an image or a sound.

(6) Comparison with Situation where No Bias Magnet is Provided

Figure 8:
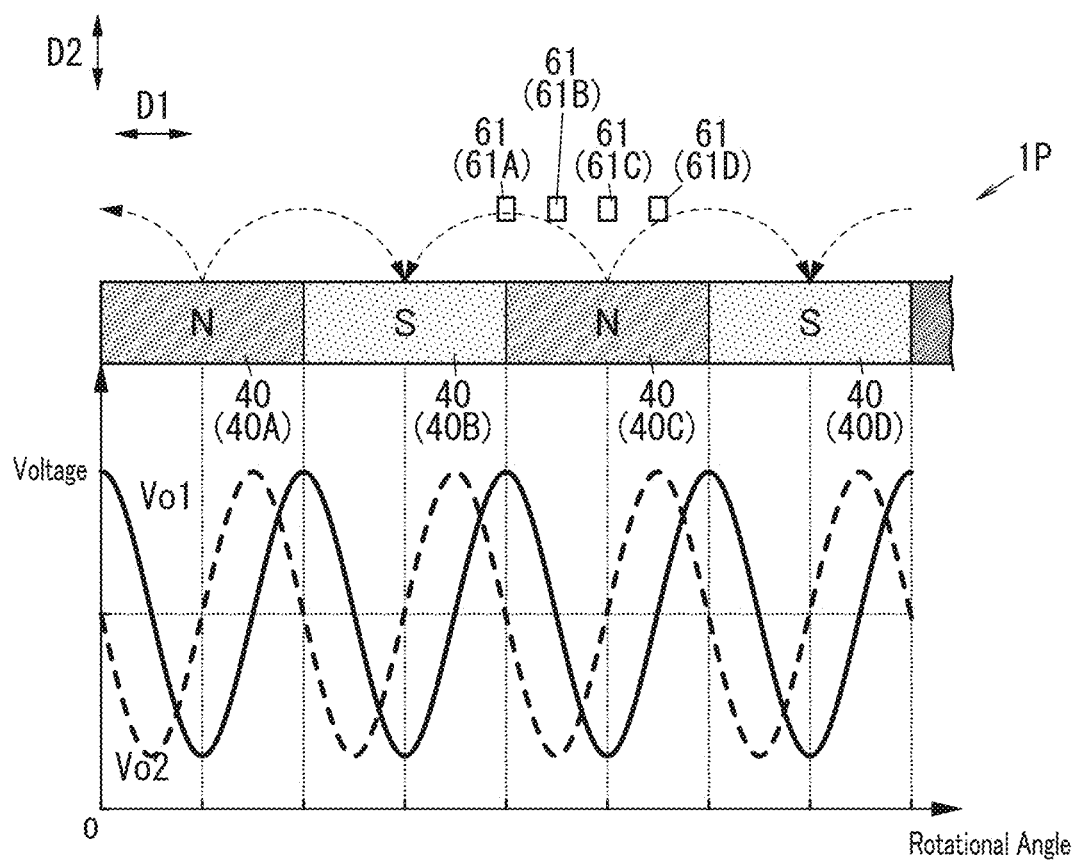
FIG. 8 illustrates a signal to be processed by a position detection system according to a comparative example.

The position detection system 1 according to this embodiment, including the bias magnet 65, achieves more advantageous effects than in a situation where no bias magnet 65 is provided. This point will be described in comparison with a position detection system 1P (refer to FIG. 8) as a comparative example.

The position detection system 1P includes no bias magnet 65, which is a difference from the position detection system 1 according to the exemplary embodiment. Also, without the bias magnet 65, the output cycle of each magnetoresistive effect element 61 with respect to the rotational angle would be one half as long as the output cycle according to the exemplary embodiment. The reason is as follows. For example, in the position detection system 1 according to the exemplary embodiment, a first magnetic field between the magnetic pole 40B (refer to FIG. 6) and the magnetic pole 40C is enhanced by the bias magnet 65, a second magnetic field between the magnetic poles 40C and 40D is weakened by the bias magnet 65, and the absolute values of the first and second magnetic fields are different from each other. In contrast, in the position detection system 1P according to the comparative example, the first magnetic field between the magnetic poles 40B and 40C has an opposite orientation from, and the same absolute value as, the second magnetic field between the magnetic poles 40C and 40D. That is why in the position detection system 1P, the output of each magnetoresistive effect element 61 with respect to the first magnetic field is the same as the output of the magnetoresistive effect element 61 with respect to the second magnetic field. Consequently, the output cycle of the magnetoresistive effect element 61 varies depending on whether the bias magnet 65 is provided or not.

As described above, the output cycle of the magnetoresistive effect element 61 in the position detection system 1P according to the comparative example is one half as long as the output cycle according to the exemplary embodiment. Thus, to generate the corresponding first voltage Vo1, second voltage Vo2, third voltage Vo3, and fourth voltage Vo4 having a sinusoidal waveform (and a cosine waveform), the interval between the plurality of magnetoresistive effect elements 61 (and 62) is set at one half of the interval according to the exemplary embodiment. That is to say, in the position detection system 1P according to the comparative example, the interval between each pair of adjacent magnetoresistive effect elements 61 is one-eighth of the interval $\theta_1$ between magnetic poles 40 having the same polarity and included in the first number of magnetic poles 40. Likewise, the interval between each pair of adjacent magnetoresistive effect elements 62 is also one-eighth of the interval $\theta_2$ between magnetic poles 50 having the same polarity and included in the second number of magnetic poles 50.

In the position detection system 1P according to the comparative example, the respective values of the first voltage Vo1, second voltage Vo2, third voltage Vo3, and fourth voltage Vo4 remain the same no matter whether the rotational angle of the magnetic pole block 3 is $\Theta$ (where $\Theta$ is an arbitrary rotational angle) or $\Theta+\pi$. Thus, the processing circuit 21 cannot distinguish, based on the first voltage Vo1, second voltage Vo2, third voltage Vo3, and fourth voltage Vo4, the rotational angles $\theta$ and $\Theta+\pi$ from each other. That is to say, according to the comparative example, the processing circuit 21 cannot detect the absolute rotational angle of the magnetic pole block 3 with respect to the magnetic sensor 6.

In contrast, in the position detection system 1 according to the exemplary embodiment, the output cycle of the magnetoresistive effect elements 61 (and 62) with respect to the rotational angle of the magnetic pole block 3 is twice as long as the output cycle according to the comparative example, and this makes the combination of the first voltage Vo1, second voltage Vo2, third voltage Vo3, and fourth voltage Vo4 different from one magnitude of the rotational angle to another. This allows the processing circuit 21 according to exemplary embodiment to detect the absolute rotational angle of the magnetic pole block 3 with respect to the magnetic sensor 6 by using a third decision value J3 obtained based on the first voltage Vo1, second voltage Vo2, third voltage Vo3, and fourth voltage Vo4.

Figure 9:
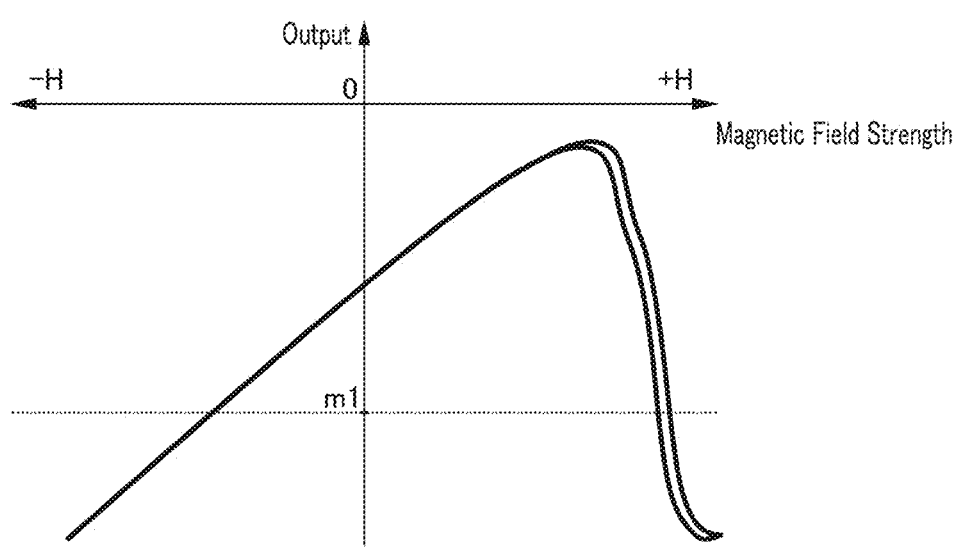
FIG. 9 shows a characteristic of the position detection system according to the exemplary embodiment.
Figure 10:
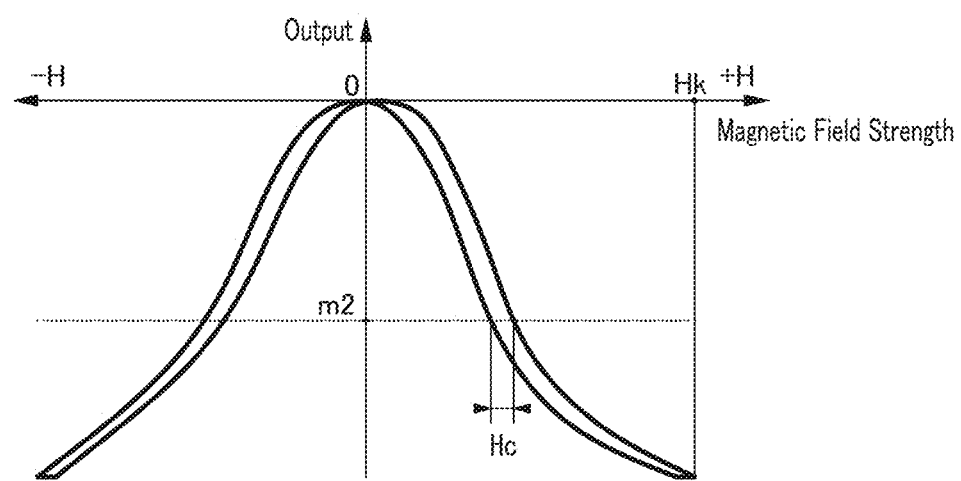
FIG. 10 shows a characteristic of the position detection system according to the comparative example.
Figure 11A:
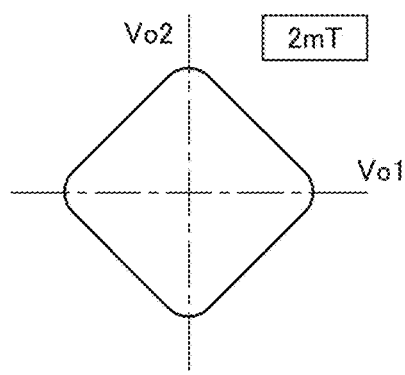
FIGS. 11A-11G show characteristics of the position detection system according to the exemplary embodiment.
Figure 11B:
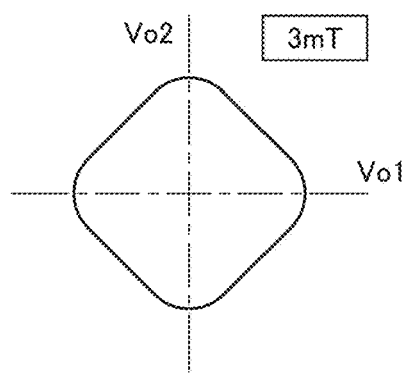
Figure 11C:
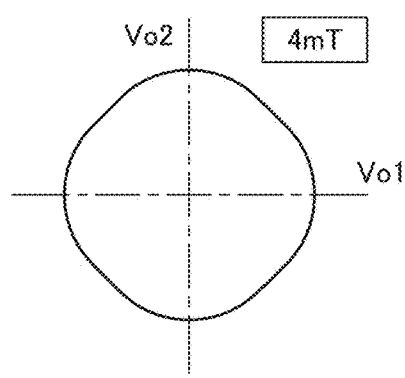
Figure 11D:
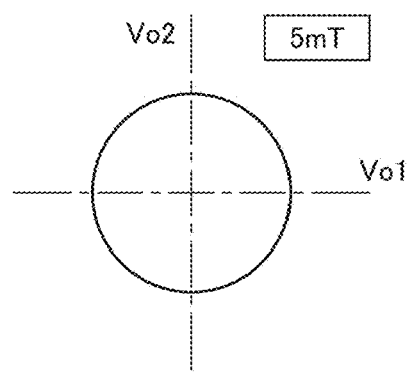
Figure 11E:
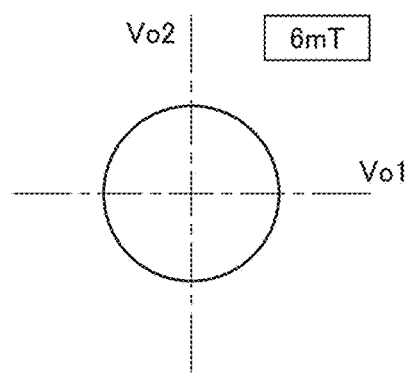
Figure 11F:
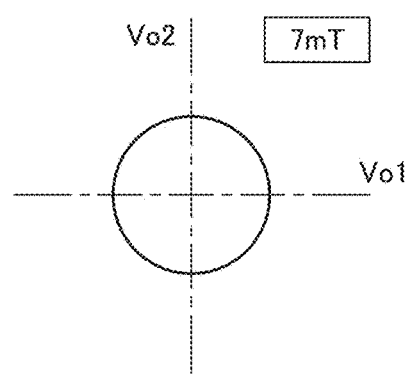
Figure 11G:
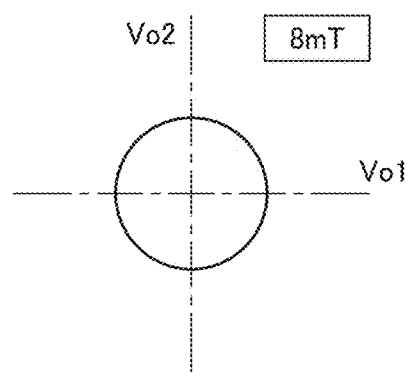

Next, another advantage to be achieved by providing the bias magnet 65 will be described with reference to FIGS. 9 and 10. FIG. 10 is a graph showing how the output of the magnetoresistive effect element 61 (or 62) changes with the magnetic field strength in the comparative example (i.e., when no bias magnet 65 is provided). FIG. 9 is a graph showing how the output of the magnetoresistive effect element 61 (or 62) changes with the magnetic field strength in the exemplary embodiment (i.e., when the bias magnet 65 is provided). In FIG. 9, the magnetic field strength indicated by the abscissa is a magnetic field, from which the magnetic field generated by the bias magnet 65 has been subtracted. Nevertheless, the output of the magnetoresistive effect element 61 indicated by the ordinate in FIG. 9 derives from both the magnetic field generated by the magnetic pole block 3 and the magnetic field generated by the bias magnet 65. That is to say, providing the bias magnet 65 changes the output characteristic of the magnetoresistive effect element 61 alone as shown in FIG. 10 into the output characteristic of the overall system including the magnetoresistive effect element 61 and the bias magnet 65 as shown in FIG. 9.

As shown in FIGS. 9 and 10, the output of the magnetoresistive effect element 61 according to the exemplary embodiment when the magnetic field strength is positive is asymmetric to the output thereof when the magnetic field strength is negative. In contrast, the output of the magnetoresistive effect element 61 according to the comparative example when the magnetic field strength is positive is symmetric to the output thereof when the magnetic field strength is negative. That is why in the position detection system 1 according to the exemplary embodiment, the output cycle of the magnetoresistive effect element 61 with respect to the rotational angle of the magnetic pole block 3 is twice as long as the output cycle according to the comparative example, as described above.

Also, in FIGS. 9 and 10, both the output characteristic when the magnetic field strength increases and the output characteristic when the magnetic field strength decreases are shown. That is to say, the magnetoresistive effect element 61 has a hysteresis characteristic. The output according to the exemplary embodiment has a smaller hysteresis than the output according to the comparative example. Thus, the exemplary embodiment enables improving the accuracy of detecting the rotational angle of the magnetic pole block 3 based on the first voltage Vo1, second voltage Vo2, third voltage Vo3, and fourth voltage Vo4.

In addition, the output of the magnetoresistive effect element 61 according to the exemplary embodiment has a better linearity with respect to the magnetic field strength than in the comparative example. Thus, according to the exemplary embodiment, the respective waveforms of the first voltage Vo1, second voltage Vo2, third voltage Vo3, and fourth voltage Vo4 are closer to an ideal sinusoidal waveform (or cosine waveform) than in the comparative example. Consequently, the exemplary embodiment enables improving the accuracy of detecting the rotational angle of the magnetic pole block 3 based on the first voltage Vo1, second voltage Vo2, third voltage Vo3, and fourth voltage Vo4.

(7) Design of Bias Magnet

In FIGS. 9 and 10, shown are the outputs m1, m2 of the magnetoresistive effect element 61 when the first voltage Vo1 (or the second voltage Vo2, the third voltage Vo3, or the fourth voltage Vo4) based on the output of the magnetoresistive effect element 61 becomes minimum. In FIG. 10, the magnitude of the hysteresis when the output of the magnetoresistive effect element 61 is equal to the output m2 corresponds to the coercivity Hc of the magnetoresistive effect element 61. Also, the absolute value (magnitude) of the magnetic field strength when the output of the magnetoresistive effect element 61 is minimum corresponds to an anisotropic magnetic field Hk of the magnetoresistive effect element 61.

The bias magnet 65 preferably applies, to each of the plurality of magnetoresistive effect elements 61, a magnetic field, of which the magnitude is equal to or greater than the coercivity Hc of each of the plurality of magnetoresistive effect elements 61 and equal to or less than the anisotropic magnetic field Hk of each of the plurality of magnetoresistive effect elements 61. In the same way, the bias magnet 65 preferably applies, to each of the plurality of magnetoresistive effect elements 62, a magnetic field, of which the magnitude is equal to or greater than the coercivity Hc of each of the plurality of magnetoresistive effect elements 62 and equal to or less than the anisotropic magnetic field Hk of each of the plurality of magnetoresistive effect elements 62. Applying a magnetic field, of which the magnitude is equal to or greater than the coercivity Hc, enables reducing the hysteresis. Meanwhile, applying a magnetic field, of which the magnitude is equal to or less than the anisotropic magnetic field Hk, enables reducing the distortion of the output waveform of each the plurality of magnetoresistive effect elements 61, 62.

The magnitude of the magnetic field to be applied by the bias magnet 65 to the plurality of magnetoresistive effect elements 61, 62 may be changed by adjusting, for example, the dimensions of the bias magnet 65 and the distances between the bias magnet 65 and the plurality of magnetoresistive effect elements 61, 62.

Basically, as the length of the bias magnet 65 as measured in the first direction D1 increases, a component of the magnetic field generated by the bias magnet 65 in the direction (i.e., the second direction D2) in which the bias magnet 65 and the plurality of magnetoresistive effect elements 61, 62 face each other decreases at the respective positions of the plurality of magnetoresistive effect elements 61, 62. Thus, it can be said that the greater the length of the bias magnet 65 as measured in the first direction D1 is, the better. Nevertheless, if the length of the bias magnet 65 as measured in the first direction D1 is excessive, then even the component of the magnetic field generated by the bias magnet 65 in the first direction D1 also decreases, which is disadvantageous.

Next, a more favorable design for the bias magnet 65 will be described.

FIGS. 11A-11G schematically show relations between the bias magnetic field strength and the respective outputs of the plurality of magnetoresistive effect elements 61. As used herein, the "bias magnetic field strength" refers to the magnitude of a magnetic field applied by the bias magnet 65 to the plurality of magnetoresistive effect elements 61. That is to say, the bias magnetic field strength herein refers to the magnitude of the magnetic field applied to the plurality of magnetoresistive effect elements 61 when no magnetic pole block 3 is provided. Also, in this example, the length of the bias magnet 65 as measured in the first direction D1 is supposed to be sufficiently greater than the interval between the plurality of magnetoresistive effect elements 61 and a magnetic field is supposed to be applied to the plurality of magnetoresistive effect elements 61 substantially parallel to the longitudinal axis of the bias magnet 65.

FIGS. 11A-11G each show a Lissajous figure, of which the abscissa indicates the first voltage Vo1 and the ordinate indicates the second voltage Vo2. The closer to a perfect circle the Lissajous figure is, the closer to an ideal sinusoidal wave the waveform of the first voltage Vo1 is and the closer to an ideal cosine wave the waveform of the second voltage Vo2 is. Thus, the closer to a perfect circle the Lissajous figure is, the more accurately the rotational angle may be detected. The numerical values attached to the Lissajous figures shown in FIGS. 11A-11G each indicate the bias magnetic field strength (e.g., 2 mT in FIG. 11A).

In FIGS. 11A-11G, the magnitude of the magnetic field applied from the magnetic pole block 3 to the plurality of magnetoresistive effect elements 61 is 5 mT. That is to say, the magnitude of the magnetic field applied to the plurality of magnetoresistive effect elements 61 when no bias magnet 65 is provided is 5 mT. Also, in FIGS. 11A-11G, the output voltage of the power supply Vcc connected to the plurality of magnetoresistive effect elements 61 is 5 V.

As shown in FIGS. 11A-11G, when the bias magnetic field strength falls within the range from 5 mT to 8 mT, the Lissajous figure is closer to a perfect circle. Thus, this range is one of preferred ranges of the bias magnetic field strength.

Figure 12:
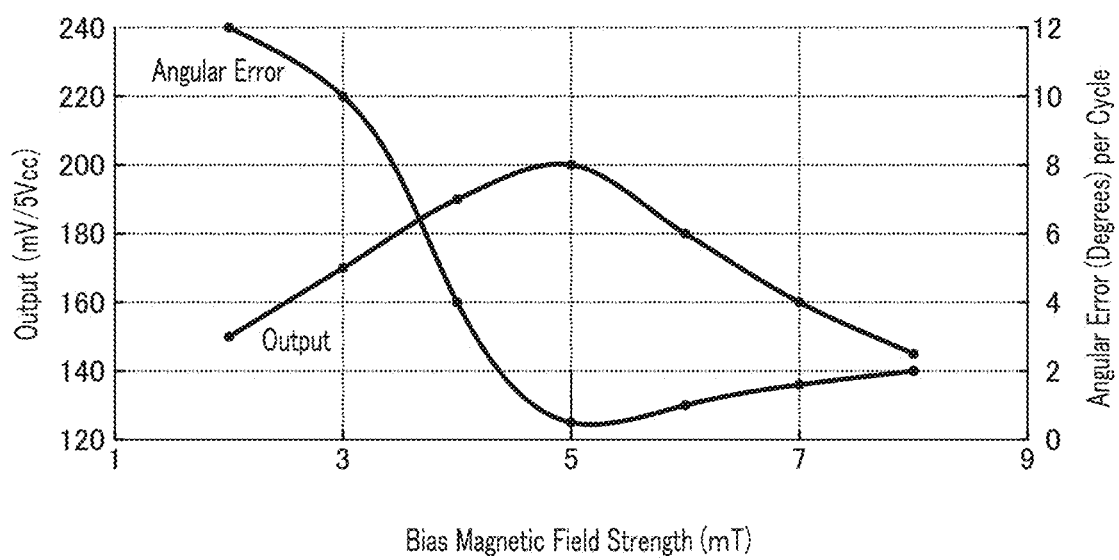
FIG. 12 shows a characteristic of the position detection system.

With respect to each of the bias magnetic field strengths shown in FIGS. 11A-11G, the amplitude (output) of the first voltage Vo1 and an angular error per cycle of the first voltage Vo1 were obtained. The results are shown in FIG. 12. The angular error per cycle corresponds to a phase shift per cycle of the first voltage Vo1.

As shown in FIG. 12, when the bias magnetic field strength is 5 mT, the output becomes maximum. Also, when the bias magnetic field strength is 5 mT, the angular error per cycle becomes minimum. Therefore, the bias magnetic field strength preferably has a value close to 5 mT. That is to say, the bias magnetic field strength preferably has a value close to the magnitude (of 5 mT) of the magnetic field applied from the magnetic pole block 3 to the plurality of magnetoresistive effect elements 61. In other words, the bias magnet 65 preferably applies, to the plurality of magnetoresistive effect elements 61, 62, a magnetic field, of which the strength corresponds to the magnitude of the magnetic field applied by the plurality of magnetic poles 40, 50 of the magnetic pole block 3 to the plurality of magnetoresistive effect elements 61, 62. The ratio of the magnitude of the magnetic field applied by the bias magnet 65 to the plurality of magnetoresistive effect elements 61, 62 to the magnitude of the magnetic field applied by the plurality of magnetic poles 40, 50 to the plurality of magnetoresistive effect elements 61, 62 is preferably equal to or greater than 90% and equal to or less than 110%, and more preferably equal to or greater than 95% and equal to or less than 105%.

(First Variation)

Next, a position detection system 1A according to a first variation will be described with reference to FIG. 13. In the following description, any constituent element of this first variation, having the same function as a counterpart of the embodiment described above, will be designated by the same reference numeral as that counterpart's, and description thereof will be omitted herein.

In the position detection system 1A according to this first variation, the first number of magnetic poles 40 are arranged side by side in a straight line on the first track 4 and the second number of magnetic poles 50 are arranged side by side in a straight line on the second track 5, which is a difference from the exemplary embodiment described above. The first direction D1 is a direction aligned with the straight line. The position detection system 1A enables detecting the position of one member selected from the magnetic sensor 6 and the magnetic pole block 3 in the first direction D1 with respect to the other member. That is to say, the position detection system 1A may be used as a linear encoder.

The interval between magnetic poles 40 having the same polarity and included in the first number of magnetic poles 40 is defined by a linear distance $L_1$ in the first direction D1. The interval between magnetic poles 50 having the same polarity and included in the second number of magnetic poles 50 is defined by a linear distance $L_2$ in the first direction D1.

The interval between the plurality of magnetoresistive effect elements 61 is defined by a linear distance between respective middles of two adjacent magnetoresistive effect elements 61. The interval between the plurality of magnetoresistive effect elements 61 is one-quarter of the linear distance $L_1$.

The interval between the plurality of magnetoresistive effect elements 62 is defined by a linear distance between respective middles of two adjacent magnetoresistive effect elements 62. The interval between the plurality of magnetoresistive effect elements 62 is one-quarter of the linear distance $L_2$.

In this first variation, the magnetic sensor 6 moves with respect to the magnetic pole block 3. The movement range A1 of the magnetic sensor 6 is a range with a rectangular shape. Within the movement range A1 of the magnetic sensor 6, the first number and the second number are preferably mutually prime. This makes the combination of the first voltage Vo1, the second voltage Vo2, the third voltage Vo3, and the fourth voltage Vo4 different from one position of the magnetic sensor 6 (or the magnetic pole block 3) in the first direction D1 to another. This enables detecting, in the first direction D1, the absolute position of one member selected from the magnetic sensor 6 and the magnetic pole block 3 with respect to the other member. In FIG. 13, the first number (five) and the second number (six) are mutually prime within the movement range A1.

According to this first variation, providing the bias magnet 65 allows the respective outputs of the plurality of magnetoresistive effect elements 61, 62 to have better linearity with respect to the magnetic field strength. This improves the position detection accuracy.

(Other Variations)

Next, other variations of the exemplary embodiment will be enumerated one after another. Note that the variations to be described below may be adopted in combination as appropriate. Alternatively, the variations to be described below may also be adopted in combination with the first variation described above.

The orientation of the magnetic field applied by the bias magnet 65 to the plurality of magnetoresistive effect elements 61, 62 does not have to exactly agree with the first direction D1 but may also be oblique to the first direction D1.

The bias magnet 65 may also be made up of a plurality of magnets which are separately provided at multiple points. For example, the bias magnet 65 may also be made up of a first magnet arranged to face the plurality of magnetoresistive effect elements 61 and a second magnet arranged to face the plurality of magnetoresistive effect elements 62.

The respective magnetic poles 40, 50 of the magnetic pole block 3 and the respective permanent magnets of the bias magnet 65 do not have to be ferrite magnets but may also be, for example, neodymium magnets.

The processing circuit 21 does not have to calculate the third decision value J3 to determine the rotational angle of the magnetic pole block 3 with respect to the magnetic sensor 6. Alternatively, the processing circuit 21 may also determine the rotational angle of the magnetic pole block 3 with respect to the magnetic sensor 6 by reference to the first voltage Vo1, the second voltage Vo2, the third voltage Vo3, and the fourth voltage Vo4.

Of the magnetic sensor 6 and the magnetic pole block 3, the magnetic sensor 6 may be movable in the first direction D1. In that case, the processing circuit 21 may determine the position (rotational angle) of the magnetic sensor 6 with respect to the magnetic pole block 3.

Alternatively, both the magnetic sensor 6 and the magnetic pole block 3 may be movable in the first direction D1. In that case, the processing circuit 21 may determine at least one of the position of the magnetic sensor 6 with respect to the magnetic pole block 3 or the position of the magnetic pole block 3 with respect to the magnetic sensor 6.

The first number of magnetic poles 40 on the first track 4 and the second number of magnetic poles 50 on the second track 5 may also be arranged side by side along the rotational axis of the magnetic pole block 3.

The interval between the plurality of magnetoresistive effect elements 61 does not have to be one-quarter of the interval $\theta_1$ between magnetic poles 40 having the same polarity and included in the first number of magnetic poles 40 but may also be ($\frac{1}{4}+M_1$) times as long as the interval $\theta_1$ (where $M_1$ is a natural number). Likewise, the interval between the plurality of magnetoresistive effect elements 62 does not have to be one-quarter of the interval $\theta_2$ between magnetic poles 50 having the same polarity and included in the second number of magnetic poles 50 but may also be ($\frac{1}{4}+M_2$) times as long as the interval $\theta_2$ (where $M_2$ is a natural number).

In the foregoing description of the present disclosure, the phrase "equal to or greater than" may also be a synonym of the phrase "greater than." From a technical point of view, there is no difference between the phrase "equal to or greater than" and the phrase "greater than." Similarly, the phrase "less than" may be a synonym of the phrase "equal to or less than" as well.

The position detection system 1 according to the present disclosure includes a computer system in the processing circuit 21 thereof, for example. The computer system may include a processor and a memory as principal hardware components thereof. At least some functions of the position detection system 1 according to the present disclosure may be performed by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive, any of which is readable for the computer system. The processor of the computer system may be made up of a single or a plurality of electronic circuits including a semiconductor integrated circuit (IC) or a large-scale integrated circuit (LSI). As used herein, the "integrated circuit" such as an IC or an LSI is called by a different name depending on the degree of integration thereof. Examples of the integrated circuits include a system LSI, a very-large-scale integrated circuit (VLSI), and an ultra-large-scale integrated circuit (ULSI). Optionally, a field-programmable gate array (FPGA) to be programmed after an LSI has been fabricated or a reconfigurable logic device allowing the connections or circuit sections inside of an LSI to be reconfigured may also be adopted as the processor. Those electronic circuits may be either integrated together on a single chip or distributed on multiple chips, whichever is appropriate. Those multiple chips may be aggregated together in a single device or distributed in multiple devices without limitation. As used herein, the "computer system" includes a microcontroller including one or more processors and one or more memories. Thus, the microcontroller may also be implemented as a single or a plurality of electronic circuits including a semiconductor integrated circuit or a large-scale integrated circuit.

Also, in the embodiment described above, the plurality of functions of the processing circuit 21 are integrated together in a single device. However, this is not an essential configuration for the processing circuit 21. Alternatively, those constituent elements of the processing circuit 21 may be distributed in multiple different devices. Still alternatively, at least some functions of the processing circuit 21 may be implemented as a cloud computing system as well.

(Recapitulation)

The embodiment and its variations described above are specific implementation of the following aspects of the present disclosure.

A position detection system (1, 1A) according to a first aspect includes a magnetic pole block (3) and a magnetic sensor (6). The magnetic pole block (3) includes a plurality of magnetic poles (40, 50) that are arranged in a first direction (D1). The magnetic sensor (6) is arranged to face the plurality of magnetic poles (40, 50) in a second direction (D2) that intersects with the first direction (D1). The plurality of magnetic poles (40, 50) are arranged such that N poles and S poles are alternately arranged as the plurality of magnetic poles (40, 50) in the first direction (D1). At least one member selected from the group consisting of the magnetic pole block (3) and the magnetic sensor (6) is movable in the first direction (D1) with respect to the other member of the group. The magnetic sensor (6) includes a plurality of magnetoresistive effect elements (61, 62) and a bias magnet (65). The plurality of magnetoresistive effect elements (61, 62) are arranged side by side in the first direction (D1). The bias magnet (65) applies, to the plurality of magnetoresistive effect elements (61, 62), a magnetic field having an orientation toward one of two opposite sides of the first direction (D1).

According to this configuration, the direction of the magnetic field applied from the bias magnet (65) to the plurality of magnetoresistive effect elements (61, 62) is aligned with the first direction (D1) and is the same direction in each of the plurality of magnetoresistive effect elements (61, 62). This improves the linearity of the respective outputs of the magnetoresistive effect elements (61, 62) with respect to the strength of the magnetic field applied from the magnetic pole block (3). Consequently, this improves the position detection accuracy when the position of one member selected from the magnetic pole block (3) and the magnetic sensor (6) is going to be detected with respect to the other member.

In a position detection system (1, 1A) according to a second aspect, which may be implemented in conjunction with the first aspect, the magnetic pole block (3) includes a first track (4) and a second track (5). The first track (4) includes a first number of magnetic poles (40) that are arranged side by side in the first direction (D1). The first number is even. The second track (5) includes a second number of magnetic poles (50) that are arranged side by side in the first direction (D1). The second number is also even. An interval between magnetic poles (40) having the same polarity and included in the first number of magnetic poles (40) is different from an interval between magnetic poles (50) having the same polarity and included in the second number of magnetic poles (50). The plurality of magnetoresistive effect elements (61, 62) includes: a plurality of first magnetoresistive effect elements (61) and a plurality of second magnetoresistive effect elements (62). The plurality of first magnetoresistive effect elements (61) are arranged side by side in the first direction (D1) and detect magnetism generated on the first track (4). The plurality of second magnetoresistive effect elements (62) are arranged side by side in the first direction (D1) and detect magnetism generated on the second track (5).

This configuration broadens the spatial position detectible range by using the outputs of the plurality of first magnetoresistive effect elements (61) and outputs of the plurality of second magnetoresistive effect elements (62).

In a position detection system (1) according to a third aspect, which may be implemented in conjunction with the second aspect, the first number of magnetic poles (40) on the first track (4) are arranged in a rotational direction as the first direction (D1) to form a circle. The second number of magnetic poles (50) on the second track (5) are arranged to form another circle concentric with the circle of the first track (4). One number selected from the group consisting of the first number and the second number is greater by two than the other number of the group.

This configuration enables detecting an absolute position (absolute angle) of one member selected from the magnetic pole block (3) and the magnetic sensor (6) with respect to the other member based on the combination of the respective outputs of the plurality of first magnetoresistive effect elements (61) and respective outputs of the plurality of second magnetoresistive effect elements (62).

In a position detection system (1, 1A) according to a fourth aspect, which may be implemented in conjunction with the second or third aspect, the plurality of first magnetoresistive effect elements (61) includes two magnetoresistive effect elements (61) arranged at an interval that is one half of the interval between the magnetic poles (40) having the same polarity and included in the first number of magnetic poles (40) on the first track (4). The plurality of second magnetoresistive effect elements (62) includes two magnetoresistive effect elements (62) arranged at an interval that is one half of the interval between the magnetic poles (50) having the same polarity and included in the second number of magnetic poles (50) on the second track (5).

This configuration enables detecting the position using the respective outputs of the plurality of first magnetoresistive effect elements (61) and the respective outputs of the plurality of second magnetoresistive effect elements (62). In addition, the magnetoresistive effect elements are arranged at a relatively narrow interval, thus enabling reducing the size of the magnetic sensor (6).

A position detection system (1, 1A) according to a fifth aspect, which may be implemented in conjunction with any one of the first to fourth aspects, further includes a processing circuit (21). The processing circuit (21) determines, based on outputs of the plurality of magnetoresistive effect elements (61, 62), a position of one member selected from the group consisting of the magnetic pole block (3) and the magnetic sensor (6) with respect to the other member of the group.

This configuration allows the position detection system (1, 1A) to perform position detection processing.

In a position detection system (1, 1A) according to a sixth aspect, which may be implemented in conjunction with any one of the first to fifth aspects, each of the plurality of magnetoresistive effect elements (61, 62) is a current-in-plane (CIP) type giant magnetoresistive effect (GMR) element.

This configuration may make the output waveform of the plurality of magnetoresistive effect elements (61, 62) closer to an ideal sinusoidal waveform (or cosine waveform) compared to using non-CIP type GMR elements (e.g., CPP type GMR elements) as the plurality of magnetoresistive effect elements (61, 62). This enables further improving the position detection accuracy.

In a position detection system (1, 1A) according to a seventh aspect, which may be implemented in conjunction with the sixth aspect, the CIP type GMR element includes a magnetic layer (641) including cobalt at a composition ratio equal to or greater than 20%.

This configuration may make the output of the CIP type GMR element relatively high.

In a position detection system (1, 1A) according to an eighth aspect, which may be implemented in conjunction with any one of the first to seventh aspects, the bias magnet (65) applies, to each of the plurality of magnetoresistive effect elements (61, 62), a magnetic field having a strength equal to or greater than a coercivity of each of the magnetoresistive effect elements (61, 62) and equal to or less than an anisotropic magnetic field of each of the plurality of magnetoresistive effect elements (61, 62).

This configuration further improves the linearity of the outputs of the respective magnetoresistive effect elements (61, 62).

In a position detection system (1, 1A) according to a ninth aspect, which may be implemented in conjunction with any one of the first to eighth aspects, the bias magnet (65) applies, to the plurality of magnetoresistive effect elements (61, 62), a magnetic field having a strength corresponding to a magnitude of the magnetic field applied by the plurality of magnetic poles (40, 50) to the plurality of magnetoresistive effect elements (61, 62).

This configuration may make the output waveform of the plurality of magnetoresistive effect elements (61, 62) closer to an ideal sinusoidal waveform (or cosine waveform).

Note that the constituent elements according to the second to ninth aspects are not essential constituent elements for the position detection system (1, 1A) but may be omitted as appropriate.

REFERENCE SIGNS LIST 1, 1A Position Detection System
3 Magnetic Pole Block
4 First Track
5 Second Track
6 Magnetic Sensor
21 Processing Circuit
50 Magnetic Pole
61 First Magnetoresistive Effect Element
62 Second Magnetoresistive Effect Element
65 Bias Magnet
641 Magnetic Layer
D1 First Direction
D2 Second Direction

The invention claimed is:

1. A position detection system comprising:
a magnetic pole block including a plurality of magnetic poles that are arranged in a first direction; and
a magnetic sensor arranged to face the plurality of magnetic poles in a second direction that intersects with the first direction, wherein:
the plurality of magnetic poles are arranged such that N poles and S poles are alternately arranged in the first direction,
one member selected from the group consisting of the magnetic pole block and the magnetic sensor is movable in the first direction with respect to the other member of the group,
the magnetic sensor includes:
a plurality of magnetoresistive effect elements arranged side by side in the first direction; and
a bias magnet configured to apply, to the plurality of magnetoresistive effect elements, a magnetic field having an orientation toward one of two opposite sides of the first direction,
the magnetic pole block includes:
a first track including a first number of magnetic poles arranged side by side in the first direction, the first number being even; and
a second track including a second number of magnetic poles arranged side by side in the first direction, the second number being even,
an interval between magnetic poles having the same polarity and included in the first number of magnetic poles is different from an interval between magnetic poles having a same polarity and included in the second number of magnetic poles, the plurality of magnetoresistive effect elements includes:
- a plurality of first magnetoresistive effect elements arranged side by side in the first direction and configured to detect magnetism generated on the first track; and
- a plurality of second magnetoresistive effect elements arranged side by side in the first direction and configured to detect magnetism generated on the second track, the plurality of first magnetoresistive effect elements include four specific first magnetoresistive effect elements bridge-connected to each other, the plurality of second magnetoresistive effect elements include four specific second magnetoresistive effect elements bridge-connected to each other, an interval between each pair of adjacent magnetoresistive effect elements included in the four specific first magnetoresistive effect elements is one quarter of an interval between magnetic poles having a same polarity and included in the first number of magnetic poles on the first track, and an interval between each pair of adjacent magnetoresistive effect elements included in the four specific second magnetoresistive effect elements is one quarter of an interval between magnetic poles having a same polarity and included in the second number of magnetic poles on the second track.

2. The position detection system of claim 1, wherein:
the first number of magnetic poles on the first track are arranged in a rotational direction as the first direction to form a circle,
the second number of magnetic poles on the second track are arranged to form another circle concentric with the circle of the first track, and
one number selected from the group consisting of the first number and the second number is greater by two than the other number of the group.

3. The position detection system of claim 1, wherein:
the plurality of first magnetoresistive effect elements includes two magnetoresistive effect elements arranged at an interval that is one half of the interval between the magnetic poles having the same polarity and included in the first number of magnetic poles on the first track, and the plurality of second magnetoresistive effect elements includes two magnetoresistive effect elements arranged at an interval that is one half of the interval between the magnetic poles having the same polarity and included in the second number of magnetic poles on the second track.

4. The position detection system of claim 1, further comprising a processing circuit configured to determine, based on outputs of the plurality of magnetoresistive effect elements, a position of one member selected from the group consisting of the magnetic pole block and the magnetic sensor with respect to the other member of the group.

5. The position detection system of claim 1, wherein
each of the plurality of magnetoresistive effect elements is a current-in-plane type giant magnetoresistive effect element.

6. The position detection system of claim 5, wherein
the current-in-plane type giant magnetoresistive effect element includes a magnetic layer including cobalt at a composition ratio equal to or greater than 20%.

7. The position detection system of claim 1, wherein
the bias magnet is configured to apply, to each of the plurality of magnetoresistive effect elements, a magnetic field having a strength equal to or greater than a coercivity of each of the magnetoresistive effect elements and equal to or less than an anisotropic magnetic field of each of the plurality of magnetoresistive effect elements.

8. The position detection system of claim 1, wherein
the bias magnet is configured to apply, to the plurality of magnetoresistive effect elements, a magnetic field having a strength corresponding to a magnitude of the magnetic field applied by the plurality of magnetic poles to the plurality of magnetoresistive effect elements.

* * * * *